(12) United States Patent
Kim et al.

(10) Patent No.: US 10,186,219 B2
(45) Date of Patent: Jan. 22, 2019

(54) DIGITAL-TO-ANALOG CONVERTER

(71) Applicant: SAMSUNG ELECTRONICS CO., LTD., Suwon-si, Gyeonggi-Do (KR)

(72) Inventors: Yong-Hun Kim, Seoul (KR); Hyunsang Park, Seongnam-si (KR); Kyungchun Kim, Yongin-si (KR); Jae-Bum Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 270 days.

(21) Appl. No.: 15/187,920

(22) Filed: Jun. 21, 2016

(65) Prior Publication Data

US 2017/0032754 A1 Feb. 2, 2017

(30) Foreign Application Priority Data

Jul. 30, 2015 (KR) .................. 10-2015-0108213

(51) Int. Cl.
*G09G 3/36* (2006.01)
*H03M 1/06* (2006.01)
*H03M 1/66* (2006.01)

(52) U.S. Cl.
CPC ........ *G09G 3/3648* (2013.01); *H03M 1/0607* (2013.01); *G09G 2310/08* (2013.01); *H03M 1/66* (2013.01)

(58) Field of Classification Search
CPC ... G09G 3/3648; G09G 2310/08; H03M 1/66; H03M 1/0607
See application file for complete search history.

(56) References Cited

U.S. PATENT DOCUMENTS

| | | | |
|---|---|---|---|
| 5,550,507 A | * | 8/1996 | Horl .................. H03D 1/04 329/361 |
| 6,327,313 B1 | | 12/2001 | Traylor et al. |
| 6,538,490 B2 | | 3/2003 | Yoshizawa |
| 7,034,608 B2 | | 4/2006 | Gai et al. |
| 7,511,694 B2 | | 3/2009 | Kim et al. |
| 7,642,846 B2 | | 1/2010 | Yan |
| 7,835,467 B2 | | 11/2010 | Gupta |
| 8,126,087 B2 | | 2/2012 | Han et al. |
| 8,476,971 B2 | | 7/2013 | Peng et al. |
| 8,525,710 B1 | | 9/2013 | Tsang et al. |
| 8,873,687 B2 | | 10/2014 | Kim et al. |

(Continued)

FOREIGN PATENT DOCUMENTS

| KR | 1020010034031 A | 4/2001 |
|---|---|---|
| KR | 100408688 B1 | 11/2003 |

(Continued)

*Primary Examiner* — Sahlu Okebato
(74) *Attorney, Agent, or Firm* — Volentine, Whitt & Francos, PLLC

(57) ABSTRACT

A digital-to-analog converter includes an amplifier including at least two input terminals corresponding to a non-inverting input terminal; and a chopping unit performing a chopping operation between voltages provided to the at least two input terminals corresponding to the non-inverting input terminal. The digital-to-analog converter has an X+Y bit structure and removes an offset by performing an interpolation chopping operation and/or a main buffer chopping operation at the same time. The digital-to-analog structure can be embodied in a small area and can process high bit image data.

19 Claims, 33 Drawing Sheets

(56) References Cited

U.S. PATENT DOCUMENTS

| | | | |
|---|---|---|---|
| 2007/0242024 A1* | 10/2007 | Sung | G09G 3/3688 345/100 |
| 2008/0084409 A1* | 4/2008 | Rao | G09G 3/3688 345/209 |
| 2008/0133760 A1 | 6/2008 | Berkvens et al. | |
| 2008/0186091 A1* | 8/2008 | Corsi | H03F 3/45094 330/69 |
| 2014/0112500 A1 | 4/2014 | Lesso | |
| 2015/0295587 A1* | 10/2015 | Garcia Gonzalez | H03M 3/356 341/121 |

FOREIGN PATENT DOCUMENTS

| | | |
|---|---|---|
| KR | 100453310 B1 | 10/2004 |
| KR | 1020050070119 A | 7/2005 |
| KR | 100604915 | 7/2006 |
| KR | 1020060099023 A | 9/2006 |
| KR | 100856769 B1 | 8/2008 |
| KR | 20080084852 A | 9/2008 |
| KR | 20130075567 A | 7/2013 |
| KR | 20140040088 A | 4/2014 |
| KR | 101472469 B1 | 12/2014 |

\* cited by examiner

FIG. 6

| MB_CHOP | 1st Frame | 2nd Frame |
|---|---|---|
| | H | L |
| V1 | VA | YOUT |
| V2 | VB | YOUT |
| V3 | YOUT | VA |
| V4 | YOUT | VB |

FIG. 10

| IN_CHOP | 1st Frame | 2nd Frame |
|---|---|---|
| | H | L |
| V1 | VA | VB |
| V2 | VB | VA |
| V3 | YOUT | YOUT |
| V4 | YOUT | YOUT |

FIG. 12

| MB_CHOP | 1st Frame | 2nd Frame | 3rd Frame | 4th Frame |
|---|---|---|---|---|
| | H | | L | |
| IN_CHOP | H | L | H | L |
| V1 | VA | VB | YOUT | YOUT |
| V2 | VB | VA | YOUT | YOUT |
| V3 | YOUT | YOUT | VA | VB |
| V4 | YOUT | YOUT | VB | VA |

FIG. 13

| | 1st Frame | 2nd Frame | 3rd Frame | 4th Frame |
|---|---|---|---|---|
| MB_CHOP | H | L | H | L |
| IN_CHOP | H | | L | |
| V1 | VA | YOUT | VB | YOUT |
| V2 | VB | YOUT | VA | YOUT |
| V3 | YOUT | VA | YOUT | VB |
| V4 | YOUT | VB | YOUT | VA |

FIG. 16

|  | Case 1 | Case 2 | Case 3 | Case 4 |
|---|---|---|---|---|
| V1 | VA | VA | VA | VB |
| V2 | VA | VA | VA | VB |
| V3 | VA | VA | VB | VB |
| V4 | VA | VB | VB | VA |
| YOUT | VA | (3*VA+VB)/4 | 2(VA+VB)/4 | 2(VA+3*VB)/4 |
| # of frames | – | 4 frames | 2 frames | 4 frames |

FIG. 18

|    | Case 1 | Case 2 | Case 3 | Case 4 |
|----|--------|--------|--------|--------|
| V1 | VA     | VA     | VA     | VA     |
| V2 | VA     | VA     | VA     | VB     |
| V3 | VA     | VA     | VB     | VB     |
| V4 | VA     | VB     | VB     | VB     |

FIG. 19

| | | 1st Frame | 2nd Frame | 3rd Frame | 4th Frame | 5th Frame | 6th Frame | 7th Frame | 8th Frame |
|---|---|---|---|---|---|---|---|---|---|
| | IN_CHOP<1:0> | LL | | LH | | HL | | HH | |
| | MB_CHOP | H | L | H | L | H | L | H | L |
| Case 1 | V1 | VA | YOUT | VA | YOUT | VA | YOUT | VA | YOUT |
| | V2 | VA | YOUT | VA | YOUT | VA | YOUT | VA | YOUT |
| | V3 | VA | YOUT | VA | YOUT | VA | YOUT | VA | YOUT |
| | V4 | VA | VA | VA | VA | VA | VA | VA | VA |
| | V5 | YOUT | VA | YOUT | VA | YOUT | VA | YOUT | VA |
| | V6 | YOUT | VA | YOUT | VA | YOUT | VA | YOUT | VA |
| | V7 | YOUT | VA | YOUT | VA | YOUT | VA | YOUT | VA |
| | V8 | YOUT | VA | YOUT | VA | YOUT | VA | YOUT | VA |

FIG. 20

| | 1st Frame | 2nd Frame | 3rd Frame | 4th Frame | 5th Frame | 6th Frame | 7th Frame | 8th Frame |
|---|---|---|---|---|---|---|---|---|
| IN_CHOP<1:0> | LL | | LH | | HL | | HH | |
| MB_CHOP | H | L | H | L | H | L | H | L |
| V1 | VA | YOUT | VA | YOUT | VA | YOUT | VB | YOUT |
| V2 | VA | YOUT | VA | YOUT | VB | YOUT | VA | YOUT |
| V3 | VA | YOUT | VB | YOUT | VA | YOUT | VA | YOUT |
| V4 | VB | YOUT | VA | YOUT | VA | YOUT | VA | YOUT |
| V5 | YOUT | VA | YOUT | VA | YOUT | VA | YOUT | VB |
| V6 | YOUT | VA | YOUT | VB | YOUT | VA | YOUT | VA |
| V7 | YOUT | VA | YOUT | VB | YOUT | VA | YOUT | VA |
| V8 | YOUT | VB | YOUT | VA | YOUT | VA | YOUT | VA |

Case 2

FIG. 21

| | | 1st frame | 2nd frame | 3rd frame | 4th frame | 5th frame | 6th frame | 7th frame | 8th frame |
|---|---|---|---|---|---|---|---|---|---|
| IN_CHOP<1:0> | | LL | | LH | | HL | | HH | |
| | MB_CHOP | H | L | H | L | H | L | H | L |
| Case 3 | V1 | VA | YOUT | VB | YOUT | VA | YOUT | VB | YOUT |
| | V2 | VA | YOUT | VB | YOUT | VA | YOUT | VB | YOUT |
| | V3 | VB | YOUT | VA | YOUT | VB | YOUT | VA | YOUT |
| | V4 | VB | YOUT | VA | YOUT | VB | YOUT | VA | YOUT |
| | V5 | YOUT | VA | YOUT | VB | YOUT | VA | YOUT | VB |
| | V6 | YOUT | VA | YOUT | VB | YOUT | VA | YOUT | VB |
| | V7 | YOUT | VB | YOUT | VA | YOUT | VB | YOUT | VA |
| | V8 | YOUT | VB | YOUT | VA | YOUT | VB | YOUT | VA |

FIG. 22

| | | 1st frame | 2nd frame | 3rd frame | 4th frame | 5th frame | 6th frame | 7th frame | 8th frame |
|---|---|---|---|---|---|---|---|---|---|
| IN_CHOP<1:0> | | LL | | LH | | HL | | HH | |
| MB_CHOP | | H | L | H | L | H | L | H | L |
| Case 4 | V1 | VA | YOUT | VB | YOUT | VB | YOUT | VB | YOUT |
| | V2 | VB | YOUT | VA | YOUT | VB | YOUT | VB | YOUT |
| | V3 | VB | YOUT | VB | YOUT | VA | YOUT | VB | YOUT |
| | V4 | VB | VA | YOUT | VB | VB | VB | VA | YOUT |
| | V5 | YOUT | VB | YOUT | VA | YOUT | VB | YOUT | VB |
| | V6 | YOUT | VB | YOUT | VB | YOUT | VA | YOUT | VB |
| | V7 | YOUT | VB | YOUT | VB | YOUT | VB | YOUT | VB |
| | V8 | YOUT | VB | YOUT | VB | YOUT | VB | YOUT | VA |

FIG. 23

| IN_CHOP | 1st Frame<br>H | 2nd Frame<br>L |
|---|---|---|
| V1 | VA | VA |
| V2 | VA | VB |
| V3 | VA | VA |
| V4 | VB | VA |

FIG. 24

| | IN_CHOP | | H | | L | |
|---|---|---|---|---|---|---|
| | MB_CHOP | | 1st Frame H | 2nd Frame L | 3rd Frame H | 4th Frame L |
| Case 1 | V1 | | VA | YOUT1 | VA | YOUT1 |
| | V2 | | VA | YOUT1 | VA | YOUT1 |
| | V3 | | VA | YOUT1 | VA | YOUT1 |
| | V4 | | VA | YOUT1 | VA | YOUT1 |
| | V5 | | YOUT1 | VA | YOUT1 | VA |
| | V6 | | YOUT1 | VA | YOUT1 | VA |
| | V7 | | YOUT1 | VA | YOUT1 | VA |
| | V8 | | YOUT1 | VA | YOUT1 | VA |

FIG. 25

| | | 1st Frame | 2nd Frame | 3rd Frame | 4th Frame |
|---|---|---|---|---|---|
| IN_CHOP | | H | | L | |
| MB_CHOP | | H | L | H | L |
| V1 | | VA | YOUT1 | VA | YOUT1 |
| V2 | | VA | YOUT1 | VB | YOUT1 |
| V3 | | VA | YOUT1 | VA | YOUT1 |
| V4 | | VB | YOUT1 | VA | YOUT1 |
| V5 | | YOUT1 | VA | YOUT1 | VA |
| V6 | | YOUT1 | VA | YOUT1 | VB |
| V7 | | YOUT1 | VA | YOUT1 | VA |
| V8 | | YOUT1 | VB | YOUT1 | VA |
| Case 2 | | | | | |

FIG. 26

| | | 1st Frame | 2nd Frame | 3rd Frame | 4th Frame |
|---|---|---|---|---|---|
| | IN_CHOP | H | H | L | L |
| | MB_CHOP | H | L | H | L |
| V1 | | VA | YOUT1 | YOUT1 | YOUT1 |
| V2 | | VA | YOUT1 | VB | YOUT1 |
| V3 | | VB | YOUT1 | VB | YOUT1 |
| V4 | | VB | YOUT1 | VA | YOUT1 |
| V5 | | YOUT1 | VA | VA | VB |
| V6 | | YOUT1 | VA | YOUT1 | VB |
| V7 | | YOUT1 | VB | YOUT1 | VA |
| V8 | | YOUT1 | VB | YOUT1 | VA |

Case 3

FIG. 27

| | | 1st Frame | 2nd Frame | 3rd Frame | 4th Frame |
|---|---|---|---|---|---|
| | IN_CHOP | H | H | L | L |
| | MB_CHOP | H | L | H | L |
| Case 4 | V1 | VA | YOUT1 | VB | YOUT1 |
| | V2 | VB | YOUT1 | VB | YOUT1 |
| | V3 | VB | YOUT1 | VA | YOUT1 |
| | V4 | VB | YOUT1 | VB | YOUT1 |
| | V5 | YOUT1 | VA | YOUT1 | VB |
| | V6 | YOUT1 | VB | YOUT1 | VB |
| | V7 | YOUT1 | VB | YOUT1 | VA |
| | V8 | YOUT1 | VB | YOUT1 | VB |

FIG. 30

|  | Case 1 | Case 2 | Case 3 | Case 4 |
|---|---|---|---|---|
| V1 | VA | VA | VA | VB |
| V3 | VA | VA | VB | VA |
| V4 | VA | VB | VB | VB |
| YOUT | VA | (3*VA+VB)/4 | 2(VA+VB)/4 | (VA+3*VB)/4 |

FIG. 31

|  | 1st Frame | 2nd Frame |
|---|---|---|
| IN_CHOP | H | L |
| V1 | VA | VA |
| V3 | VB | VB |
| V4 | VB | VA |
| YOUT | (2*VA+VA+VB)/4 | (2*VA+VB+VA)/4 |

FIG. 32

| IN_CHOP | 1st Frame | 2nd Frame |
|---|---|---|
|  | H | L |
| V1 | VA | VB |
| V3 | VB | VA |
| V4 | VB | VA |
| YOUT | 2(VA+VB)/4 | 2(VA+VB)/4 |

FIG. 33

| IN_CHOP | 1st Frame | 2nd Frame |
|---|---|---|
|  | H | L |
| V1 | VB | VB |
| V3 | VA | VB |
| V4 | VB | VA |
| YOUT | (2*VB+VA+VB)/4 | (2*VB+VB+VA)/4 |

DIGITAL-TO-ANALOG CONVERTER

CROSS-REFERENCE TO RELATED APPLICATIONS

A claim of priority under 35 U.S.C. § 119 is made to Korean Patent Application No. 10-2015-0108213, filed Jul. 30, 2015, the entire contents of which are hereby incorporated by reference.

BACKGROUND

The inventive concept described herein relates to digital-to-analog converters, and more particularly, to a digital-to-analog converter performing an operation of removing an offset.

In order to express or display images that look more natural, there has been a trend to configure display devices so as to express gray scale images using image data having more than 10 bits. For example, in the case of display devices used in TVs, notebooks, smart phones or the like, image data of more than 10 bits is required. In the case of medical apparatuses, image data of more than 16 bits is required. In order to express a gamma value easily, image data having a high number of bits is also needed. In a driving circuit of a display device, a digital-to-analog converter (DAC) using a resistor array in which a gamma value may be easily and accurately expressed is often used. However, a problem associated with DACs is that every 1 bit increase in the number of bits attained by the DAC typically necessitates a twofold increase in the area of the DAC, making it difficult to manage image data of more than 10 bits.

SUMMARY

Embodiments of the inventive concept provide a digital-to-analog converter. The digital-to-analog converter includes an amplifier including at least two input terminals corresponding to a non-inverting input terminal; and a chopping unit configured to perform a chopping operation between voltages provided to the at least two input terminals corresponding to the non-inverting input terminal.

Embodiments of the inventive concept also provide a digital-to-analog converter. The digital-to-analog converter includes an amplifier including at least two input terminals corresponding to a non-inverting input terminal and at least two input terminals corresponding to an inverting input terminal; a first chopping unit configured to perform a chopping operation between the at least two input terminals corresponding to the non-inverting input terminal; and a second chopping unit configured to perform a chopping operation between the non-inverting input terminal and the inverting input terminal.

Embodiments of the inventive concept further provide a display device. The display device includes a display panel including a plurality of pixels connected to gate lines and source lines; and a source driver including a plurality of source driver cells configured to output gray scale voltages corresponding to received RGB data to the display panel through the source lines. The source driver cells each include a digital-to-analog converter. The digital-to-analog converter includes an amplifier including at least two input terminals corresponding to a non-inverting input terminal, at least two input terminals corresponding to an inverting input terminal, and an output terminal configured to provide a corresponding gray scale voltage from among the gray scale voltages; a control unit configured to generate at least first and second voltages responsive to the RGB data; and a chopping unit configured to selectively provide the at least first and second voltages to the amplifier and perform a chopping operation between the at least first and second voltages provided to the at least two input terminals corresponding to the non-inverting input terminal.

BRIEF DESCRIPTION OF THE FIGURES

Embodiments of the inventive concept will be described below in more detail with reference to the accompanying drawings. The embodiments of the inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Like numbers refer to like elements throughout.

FIG. 6 illustrates bias conditions by frame of a main buffer chopping operation.

FIG. 10 illustrates bias conditions by frame of an interpolation chopping operation.

FIG. 12 illustrates an example of an offset removal method of a digital-to-analog converter of FIG. 11.

FIG. 13 illustrates another example of an offset removal method of a digital-to-analog converter of FIG. 11.

FIG. 16 illustrates a drawing for explaining levels of voltages provided to V1~V4 terminals of an amplifier and the number of times of frames needed to perform an interpolation chopping operation in an interpolation chopping operation.

FIGS. 18, 19, 20, 21 and 22 illustrate bias conditions for explaining an operation of a digital-to-analog converter of FIG. 17.

FIG. 23 illustrates a drawing for explaining a digital-to-analog converter capable of reducing chopping time while supporting a function of removing an offset in accordance with exemplary embodiments of the inventive concept.

FIGS. 24, 25, 26 and 27 illustrate drawings for explaining a digital-to-analog converter supporting not only an interpolation chopping operation between grouped terminals but also a main buffer chopping operation.

FIG. 30 illustrates levels of voltages being provided to V1, V3 and V4 terminals of an amplifier of FIG. 28 and cases of its output voltage in an interpolation chopping operation.

FIGS. 31, 32 and 33 illustrate bias conditions in each case by example.

DETAILED DESCRIPTION

Figure 1:
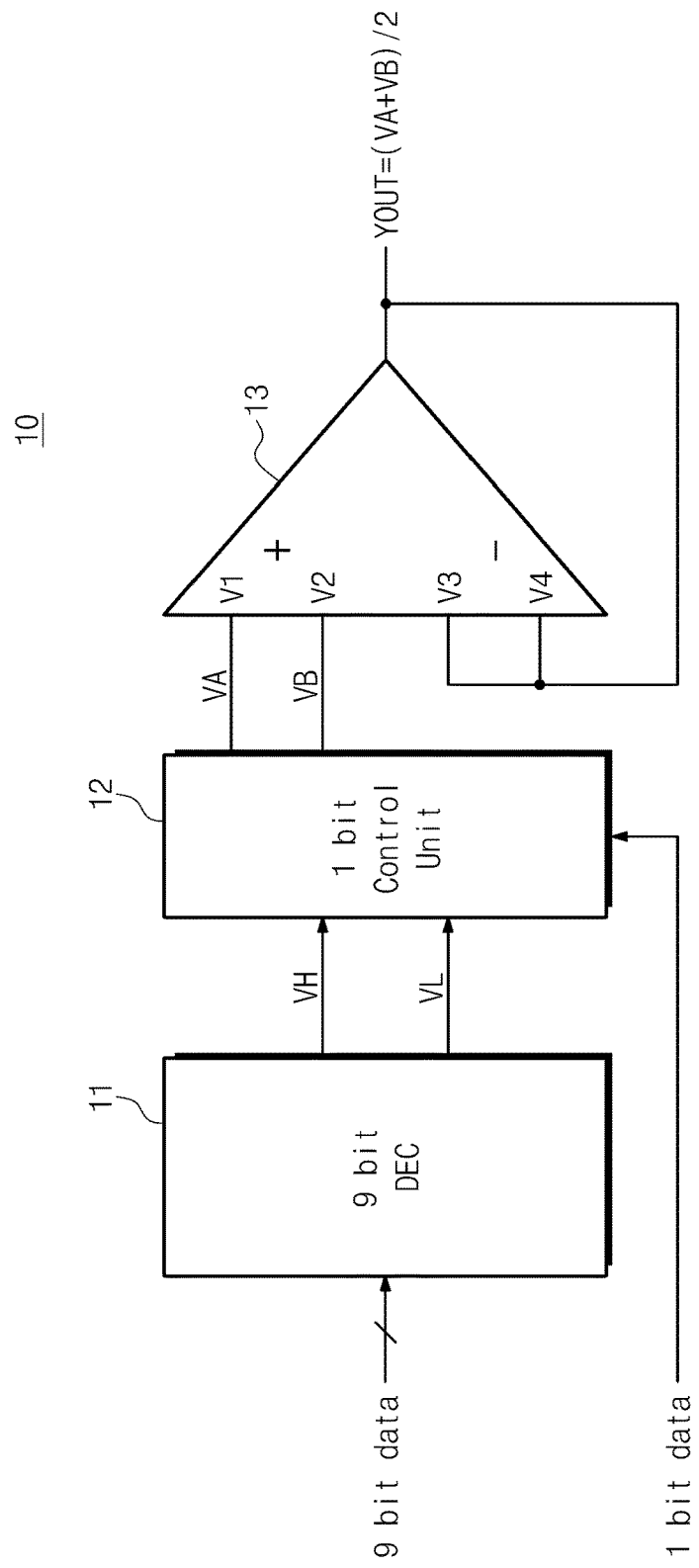
FIG. 1 illustrates a block diagram of a digital-to-analog converter in accordance with embodiments of the inventive concept.

Embodiments of inventive concepts will be described more fully hereinafter with reference to the accompanying drawings, in which embodiments of the inventive concept are shown. The inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

FIG. 1 illustrates a block diagram of a digital-to-analog converter (DAC) 10 in accordance with embodiments of the inventive concept. A digital-to-analog converter 10 of FIG. 1 is embodied in an X+Y bit structure to minimize a size of a chip into which the digital-to-analog converter 10 is loaded. For convenience of description, a digital-to-analog converter of 9+1 bit structure capable of processing image data of 10 bits is illustrated in FIG. 1 by example. Referring to FIG. 1, the digital-to-analog converter 10 includes a 9-bit decoder 11, a 1-bit control unit 12 and an amplifier 13.

The 9-bit decoder 11 receives 9-bit data. The 9-bit decoder 11 selects and outputs two adjacent voltage levels VH and VL using the 9-bit data. The 9-bit decoder 11 may be embodied using, for example, a resistor-string digital-to-analog converter (R-string DAC) or a capacitor digital-to-analog converter (capacitor DAC).

The 1-bit control unit 12 and the amplifier 13 operate as a buffer or a unity-gain buffer. The unity-gain buffer receives 1-bit data from an external device and can generate different voltage levels by dividing a range between two adjacent voltage levels VH and VL using an interpolation operation of an amplifier.

The 1-bit control unit 12 receives VH and VL which are two adjacent voltage levels from the 9-bit decoder 11 and receives 1-bit data from the external device. The 1-bit control unit 12 generates voltage levels of VA and VB using the VH, the VL and the 1-bit data. The 1-bit control unit 12 provides the VA and the VB to a first terminal V1 and a second terminal V2 of the amplifier 13 respectively. For example, the VA and the VB may have a different voltage level between the VH and the VL respectively. As another example, the VA and the VB may be equal to a voltage level of the VH and the VL, respectively. As another example, at least one of the VA and the VB may be equal to a voltage level of at least one of the VH and the VL.

The amplifier 13 includes two terminals V1 and V2 connected to a non-inverting input terminal (+), and two terminals V3 and V4 connected to an inverting input terminal (−). The V1 terminal and the V2 terminal are connected to the 1-bit control unit 12 and receive any one of the voltage levels of VA and VB from the 1-bit control unit 12. The V3 terminal and the V4 terminal are all connected to an output terminal YOUT. A structure of the amplifier 13 will be described in further detail with reference to FIG. 2.

Figure 2:
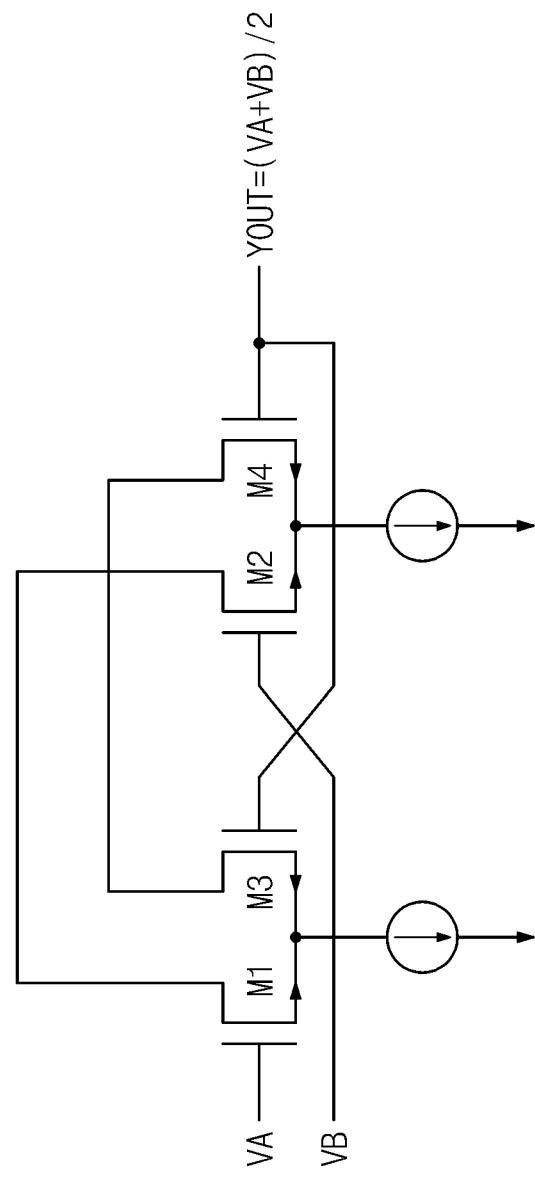
FIG. 2 illustrates a circuit diagram of an amplifier of FIG. 1 in further detail.

FIG. 2 illustrates a circuit diagram of an amplifier of FIG. 1 in further detail. As an embodiment according to an inventive concept, an amplifier 13 including two differential operational amplifiers is illustrated in FIG. 2. Referring to FIGS. 1 and 2, a non-inverting input terminal (+) and an inverting input terminal (−) of the amplifier 13 are each comprised of two terminals respectively. The V1 and V2 terminals corresponding to the non-inverting input terminal (+) correspond to gates of a first transistor M1 and a second transistor M2 respectively. The V3 and V4 terminals corresponding to the inverting input terminal (−) correspond to gates of a third transistor M3 and a fourth transistor M4 respectively. The first transistor M1 and the third transistor M3 including the corresponding constant current source may be characterized as a first differential operational amplifier, and the second transistor M2 and the fourth transistor M4 including the corresponding constant current source may be characterized as a second differential operational amplifier.

To output analog voltage levels corresponding to received digital data, any one of the voltage levels of VA and VB is provided to the V1 terminal and the V2 terminal of the amplifier 13. For example, the same voltage level may be provided to both the V1 terminal and the V2 terminal of the amplifier 13. If the voltage level of VA (or the voltage level of VB) is provided to both the V1 terminal and the V2 terminal of the amplifier 13, the voltage level of VA (or the voltage level of VB) is output from the output terminal YOUT of the amplifier 13.

As another example, different voltage levels may be provided to the V1 terminal and the V2 terminal of the amplifier 13. If the voltage level of VA and the voltage level of VB (or the voltage level of VB and the voltage level of VA) are provided to the V1 terminal and the V2 terminal of the amplifier 13 respectively, a voltage level of (VA+VB)/2 may be output from the output terminal YOUT. That is, a voltage gap between two adjacent analog voltage levels VA and VB may be divided correspondingly to provide the received digital data (e.g., 1-bit data) through an interpolation operation of the amplifier 13.

As described above, a digital-to-analog converter may be embodied in an X+Y bit structure such as a 9+1 bit structure. By embodying a digital-to-analog converter in an X+Y bit structure, an area needed to implement the digital-to-analog converter may be reduced. For example, as illustrated in FIGS. 1 and 2, in the case of embodying a 10-bit digital-to-analog converter in a 9+1 bit structure, an area occupied by a decoder is reduced to half. Since the area occupied by a decoder in a digital-to-analog converter is relatively large compared with the area occupied by other devices in the digital-to-analog converter, although a digital-to-analog converter of 9+1 bit structure additionally needs the 1-bit control unit 12 as compared with a general digital-to-analog converter of 10-bit structure, an area of the digital-to-analog converter embodied in a 9+1 bit structure is reduced by 30~40% as a whole.

However, if a digital-to-analog converter is embodied in an X+Y bit structure, an offset of the amplifier within the digital-to-analog converter may increase. For example, if an amplifier is embodied as illustrated in FIG. 2, due to nonlinear characteristics of the first through fourth transistors M1~M4, transconductance Gm of the first through fourth transistors M1~M4 may become different from one another and this may cause an increase of an offset. As another example, mismatching between the transistors M1 and M2 corresponding to the non-inverting input terminal (+) or mismatching between the transistors M3 and M4 corresponding to the inverting input terminal (−) may occur, and this may cause an increase of an offset.

The offset may become a problem in the case that different voltage levels are provided to the V1 terminal and the V2 terminal. Hereinafter, according to exemplary embodiments of the inventive concept, a structure of a digital-to-analog converter capable of removing an offset of an amplifier that occurs in the case that different voltage levels are provided to the V1 terminal and the V2 terminal, and a method of operating the digital-to-analog converter, will be described in detail.

Figure 3:
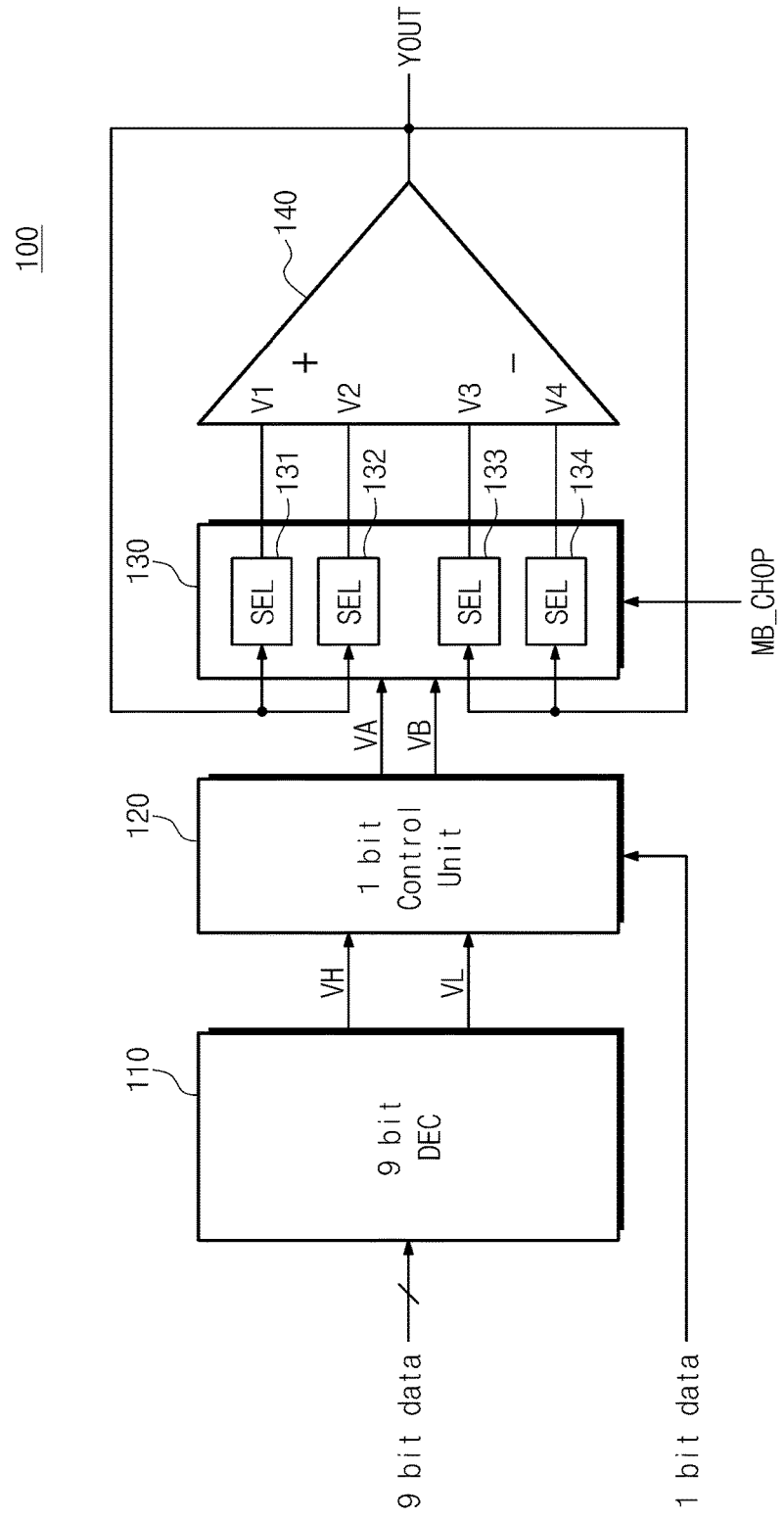
FIG. 3 illustrates a block diagram of an example of a digital-to-analog converter supporting a function of removing an offset in accordance with embodiments of the inventive concept.

FIG. 3 illustrates a block diagram of an example of a digital-to-analog converter 100 supporting a function of removing an offset in accordance with exemplary embodiments of the inventive concept. For convenience of description, the digital-to-analog converter 100 having a 9+1 bit structure is illustrated in FIG. 3. Referring to FIG. 3, the digital-to-analog converter 100 includes a 9-bit decoder 110, a 1-bit control unit 120, a chopping unit 130, and an amplifier 140.

The digital-to-analog converter 100 of FIG. 3 is similar to the digital-to-analog converter 10, except that the digital-to-analog converter 100 further includes the chopping unit 130. Thus, hereinafter, the inventive concept will be mainly described with respect to the chopping unit 130 and a chopping operation (that may also be characterized as an alternating operation) provided by the chopping unit 130. To explain a method in which the chopping operation removes an offset of an amplifier, it is assumed that VA and VB having different voltage levels with respect to each other are provided from the 1-bit control unit 120 to the chopping unit 130.

The chopping unit 130 is disposed between the 1-bit control unit 120 and the amplifier 140. The chopping unit 130 includes first through fourth select switches 131~134, and the first through fourth select switches 131~134 are connected to first through fourth terminals V1~V4 respectively of amplifier 140. The chopping unit 130 controls the first through fourth select switches 131~134 so that a main buffer chopping operation is performed in response to a main buffer chopping signal MB_CHOP. Here, the main buffer chopping operation means an operation of crossing input voltages provided to differential pairs of the amplifier 140 by frame, to remove an offset between the differential pairs of the amplifier 140. For example, the chopping unit 130 controls the first through fourth select switches 131~134 so that the VA and the VB are provided to a first differential pair (terminals V1, V2) of the amplifier 140 respectively in a first frame, and the VA and the VB are provided to a second differential pair (terminals V3, V4) of the amplifier 140 respectively in a second frame. The main buffer chopping operation of the chopping unit 130 will be described in further detail with reference to FIGS. 4 through 6.

Figure 4:
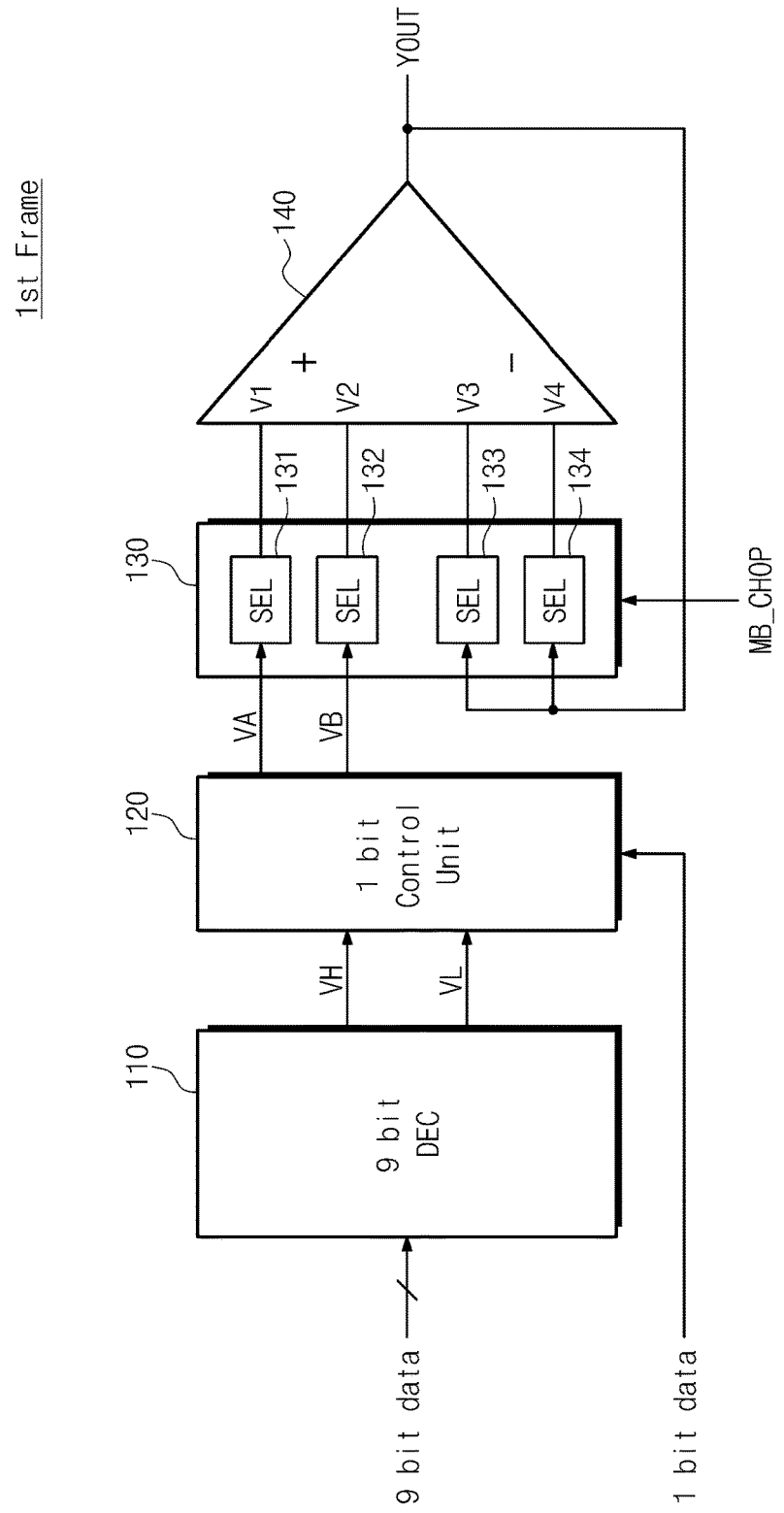
FIG. 4 illustrates a main buffer chopping operation in a first frame.
Figure 5:
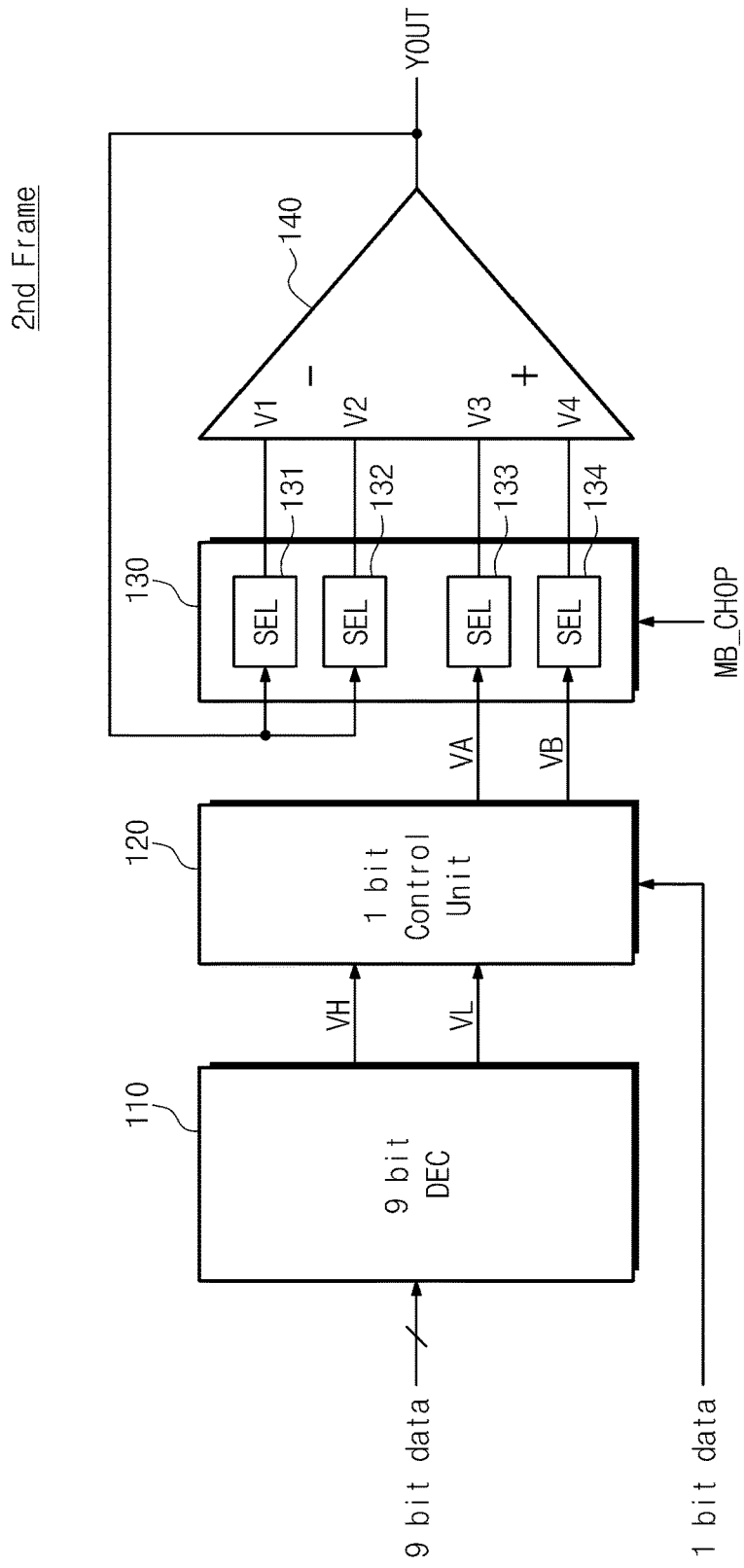
FIG. 5 illustrates a main buffer chopping operation in a second frame.

FIGS. 4 through 6 illustrate the main buffer chopping operation of the digital-to-analog amplifier 100 of FIG. 3 in accordance with exemplary embodiments of the inventive concept. More specifically, FIG. 4 illustrates a main buffer chopping operation in a first frame, FIG. 5 illustrates a main buffer chopping operation in a second frame, and FIG. 6 illustrates bias conditions by frame of a main buffer chopping operation.

Referring to FIGS. 4 and 6, in a first frame, a main buffer chopping signal MB_CHOP is at high (H) state. In response to the main buffer chopping signal MB_CHOP of high (H) state, the chopping unit 130 controls the first and second select switches 131 and 132 so that the VA and the VB are respectively provided to the first differential pair (V1, V2) of the amplifier 140. In response to the main buffer chopping signal MB_CHOP of high (H) state, the chopping unit 130 controls the third and fourth select switches 133 and 134 so that the second differential pair (V3 and V4) of the amplifier 140 is connected to the output terminal YOUT. Accordingly, the first differential pair (V1, V2) corresponds to a non-inverting input terminal (+) receiving the VA and the VB, and the second differential pair (V3 and V4) corresponds to an inverting input terminal (−) connected to the output terminal YOUT.

Referring to FIGS. 5 and 6, in a second frame, the main buffer chopping signal MB_CHOP is at low (L) state. In response to the main buffer chopping signal MB_CHOP of low (L) state, the chopping unit 130 controls the third and fourth select switches 133 and 134 so that the VA and the VB are provided to the second differential pair (V3, V4) of the amplifier 140. In response to the main buffer chopping signal MB_CHOP of low (L) state, the chopping unit 130 controls the first and second select switches 131 and 132 so that the first differential pair (V1, V2) of the amplifier 140 are connected to the output terminal YOUT. Accordingly, unlike the case of the first frame, the first differential pair (V1, V2) corresponds to an inverting input terminal (−) connected to the output terminal YOUT, and the second differential pair (V3, V4) corresponds to a non-inverting input terminal (+) receiving the VA and the VB.

As described above, by the main buffer chopping operation, in the first frame, the first differential pair (V1, V2) and the second differential pair (V3, V4) correspond to the non-inverting input terminal (+) and the inverting input terminal (−) respectively, but in the second frame, the second differential pair (V3, V4) and the first differential pair (V1, V2) correspond to the non-inverting input terminal (+) and the inverting input terminal (−) respectively. Thus, the digital-to-analog converter 100 can reduce an output voltage deviation (DVO) between the first differential pair (V1, V2) and the second differential pair (V3, V4) by calculating an output value in the first frame and an output value in the second frame respectively, and then calculating an average of the two output values. That is, the digital-to-analog converter 100 can remove an offset between the differential pairs by alternately providing an input voltage to the differential pairs of the amplifier 140.

The main buffer chopping operation of FIGS. 4 through 6 removes an offset between the differential pairs, but an offset may still exist between terminals corresponding to the same differential pair. For example, referring to FIGS. 1 and 2, an offset due to mismatching between the first transistor M1 and the second transistor M2 may still exist. Hereinafter, an embodiment of the inventive concept capable of removing even an offset between terminals corresponding to the same non-inverting input terminal (+) or the same inverting input terminal (−) will be described.

Figure 7:
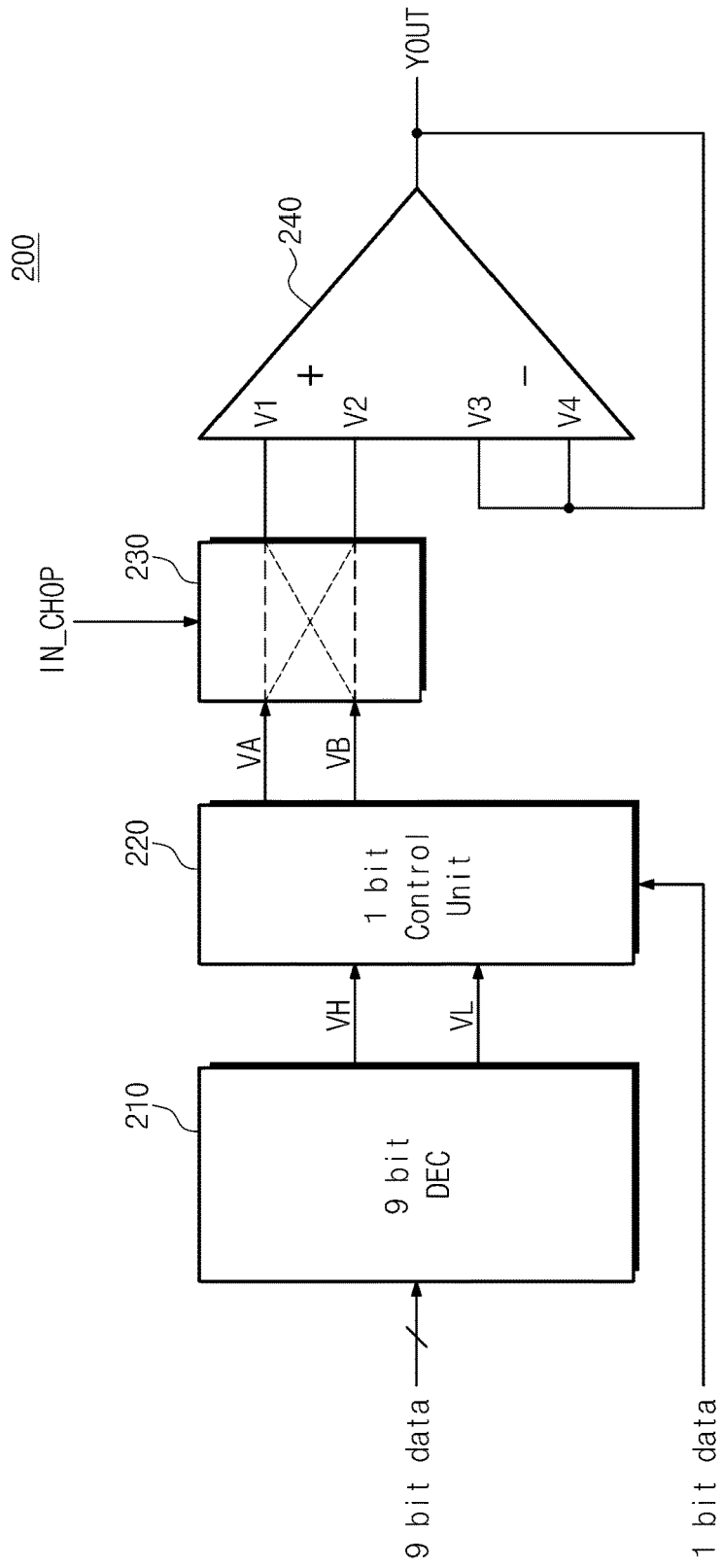
FIG. 7 illustrates a block diagram of another example of a digital-to-analog converter supporting a function of removing an offset in accordance with embodiments of the inventive concept.

FIG. 7 illustrates a block diagram of another example of a digital-to-analog converter 200 supporting a function of removing an offset in accordance with embodiments of the inventive concept. The digital-to-analog converter 200 of FIG. 7 is similar to the digital-to-analog converters 10 and 100 of FIGS. 1 and 3, except for a chopping unit 230 and an interpolation chopping operation controlled by the chopping unit 230. Thus, similar constituent elements are described using similar reference numerals, and repetitive description of similar constituent elements will be omitted. For brevity and clarity of description, it is assumed that the digital-to-analog converter 200 of FIG. 7 is embodied in a 9+1 structure such as in FIG. 3.

Referring to FIG. 7, the digital-to-analog converter 200 includes a 9-bit decoder 210, a 1-bit control unit 220, a chopping unit 230 and an amplifier 240. The chopping unit 230 is disposed between the 1-bit control unit 220 and the amplifier 240. The chopping unit 230 is connected to V1 and V2 terminals of the amplifier 240 and provides VA or VB from the 1-bit control unit 220 to the V1 and V2 terminals of the amplifier 240.

Unlike the digital-to-analog converter 100 of FIG. 3, the digital-to-analog converter 200 of FIG. 7, in response to an interpolation chopping signal IN_CHOP, supports an interpolation chopping operation for removing an offset between the terminals (V1, V2) corresponding to a non-inverting input terminal (+) of the amplifier 240. The digital-to-analog converter 200 of FIG. 7 also can support an interpolation chopping operation for removing an offset between terminals (V3, V4) corresponding to an inverting input terminal (−) of the amplifier 240 in response to an interpolation chopping signal IN_CHOP. Here, the interpolation chopping operation means an operation of crossing input voltages provided to terminals corresponding to the same polarity by frame, to remove an offset between the terminals corresponding to the same polarity of the amplifier 240. For example, the chopping unit 230 respectively provides the VA and the VB to the V1 terminal and the V2 terminal corresponding to the non-inverting input terminal (+) in a first frame. The chopping unit 230 respectively provides the VB and the VA to the V1 terminal and the V2 terminal in a second frame. The interpolation chopping operation of the chopping unit 230 will be described in further detail with reference to FIGS. 8 through 10.

Figure 8:
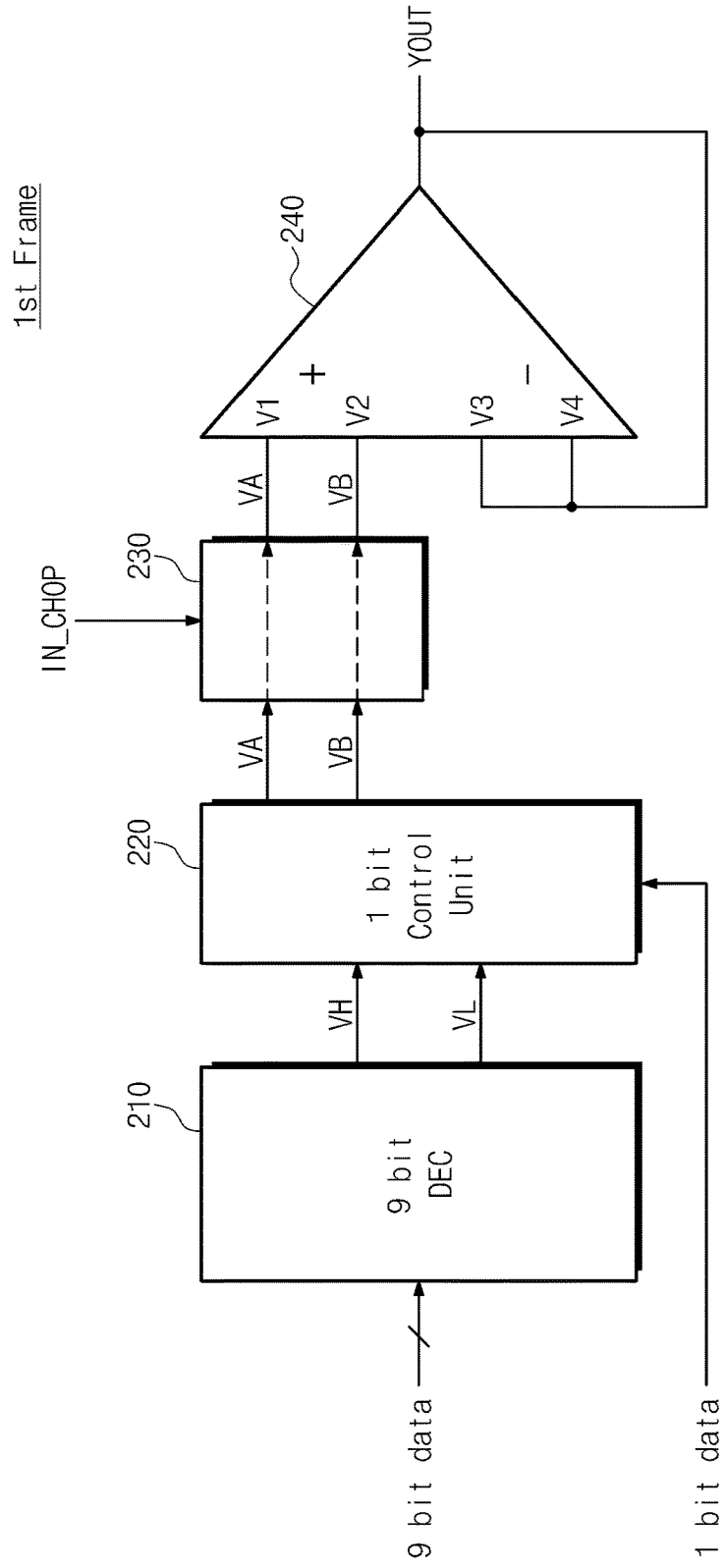
FIG. 8 illustrates an interpolation chopping operation in a first frame.
Figure 9:
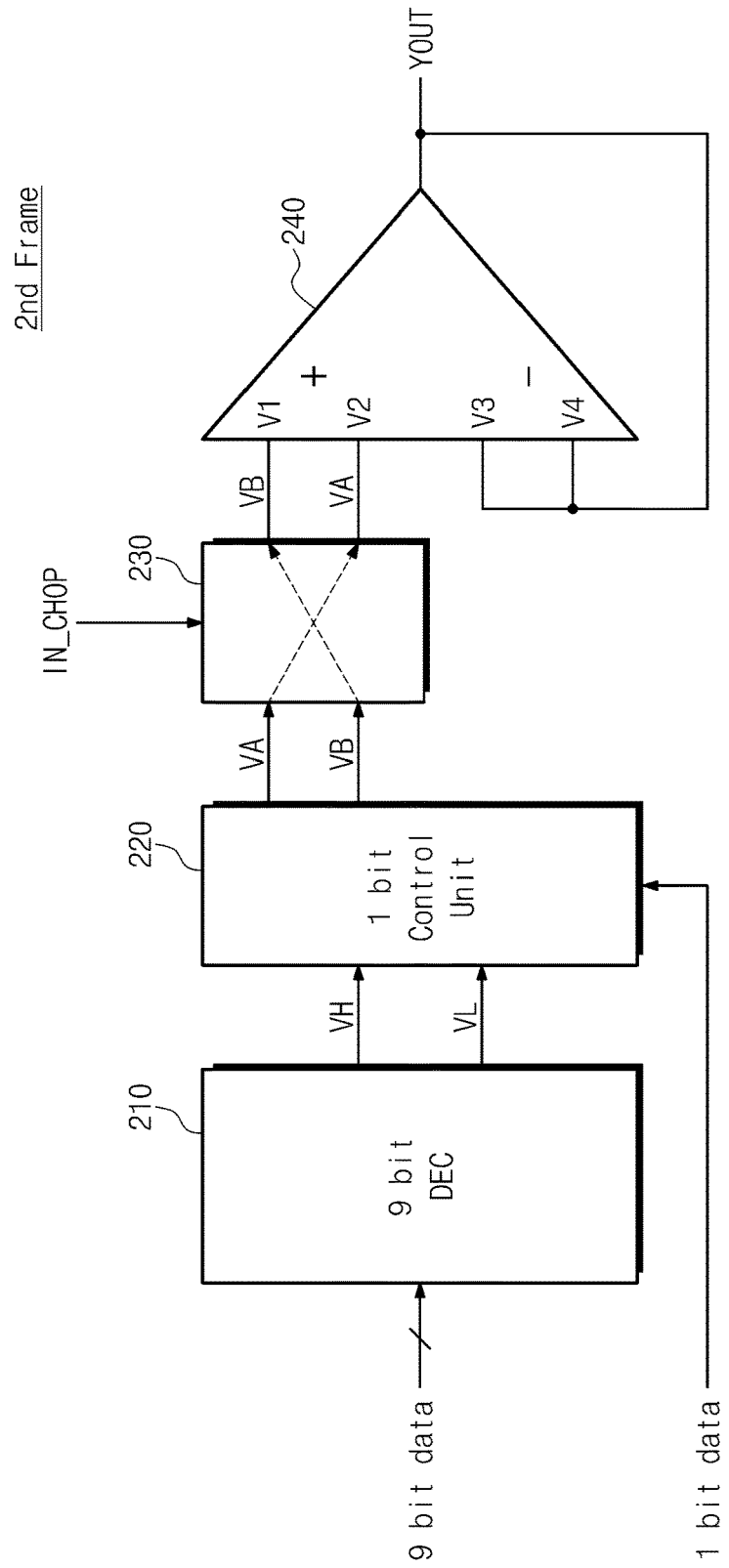
FIG. 9 illustrates an interpolation chopping operation in a second frame.

FIGS. 8 through 10 illustrate an interpolation chopping operation of the digital-to-analog amplifier 200 of FIG. 7 in accordance with embodiments of the inventive concept. More specifically, FIG. 8 illustrates an interpolation chopping operation in a first frame, FIG. 9 illustrates an interpolation chopping operation in a second frame, and FIG. 10 illustrates bias conditions by frame of an interpolation chopping operation.

Referring to FIGS. 8 and 10, in a first frame, an interpolation chopping signal IN_CHOP is at high (H) state. In response to the interpolation chopping signal IN_CHOP of the high (H) state, the chopping unit 230 respectively provides VA and VB to the V1 and V2 terminals corresponding to a non-inverting input terminal (+). In this case, since the V3 and V4 terminals corresponding to an inverting input terminal (−) are connected to an output terminal YOUT, a voltage level of (VA+VB)/2 is output from the output terminal YOUT.

Referring to FIGS. 9 and 10, in a second frame, an interpolation chopping signal IN_CHOP is at low (L) state. In response to the interpolation chopping signal IN_CHOP of the low (L) state, the chopping unit 230 respectively provides the VB and VA to the V1 and V2 terminals corresponding to a non-inverting input terminal (+). That is, as compared with the case of the first frame, the chopping unit 230, in the second frame, crosses the VA and the VB and then provides the crossed VB and VA to the V1 terminal and the V2 terminal of the amplifier 240 respectively. In this case, a voltage level of (VB+VA)/2 is output from the output terminal YOUT.

By the interpolation chopping operation, in the first frame, the VA and the VB are provided to the V1 and V2 terminals respectively, but in the second frame, the VB and the VA are provided to the V1 and V2 terminals respectively. Thus, the digital-to-analog converter 200 can reduce an output voltage deviation (DVO) between the V1 terminal and the V2 terminal by calculating an output value in the first frame and an output value in the second frame respectively and then calculating an average of the two output values. Through the interpolation chopping operation described in FIGS. 7 to 10, an offset caused by mismatching between the transistors M1 and M2 (refer to FIG. 2) corresponding to the non-inverting input terminal (+) or an offset caused by mismatching between the transistors M3 and M4 (refer to FIG. 2) corresponding to the inverting input terminal (−) may be reduced.

Figure 11:
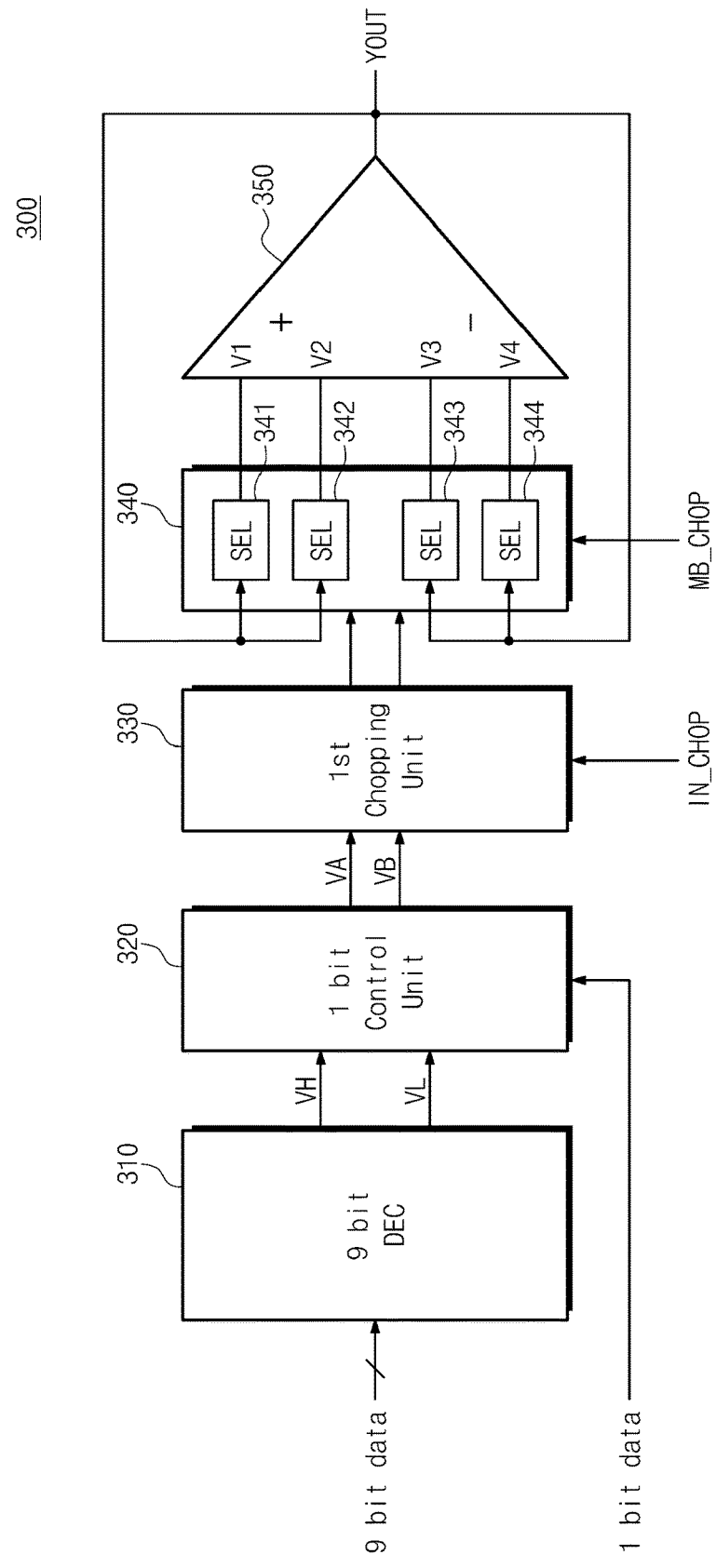
FIG. 11 illustrates still another example of a digital-to-analog converter supporting a function of removing an offset in accordance with embodiments of the inventive concept.

FIG. 11 illustrates a block diagram of still another example of a digital-to-analog converter supporting a function of removing an offset in accordance with embodiments of the inventive concept. The digital-to-analog converter 300 of FIG. 11 can support the main buffer chopping operation described with respect to FIGS. 3 through 6 and the interpolation chopping operation described with respect to FIGS. 7 through 10 at the same time. Since the digital-to-analog converter 300 of FIG. 11 is similar to the digital-to-analog converters 100 and 200 of FIGS. 3 and 7, similar constituent elements are described using similar reference numerals. For brevity of description, it is assumed that the digital-to-analog converter 300 of FIG. 11 is embodied in a 9+1 bit structure as illustrated in FIGS. 3 and 7, and repetitive description will be omitted.

Referring to FIG. 11, the digital-to-analog converter 300 includes a 9-bit decoder 310, a 1-bit control unit 320, a first chopping unit 330, a second chopping unit 340, and an amplifier 350. The first chopping unit 330 is controlled to perform an interpolation chopping operation similar to the chopping unit 230 of FIG. 7. The second chopping unit 340 is controlled to perform a main buffer chopping operation similar to the chopping unit 130 of FIG. 3. An operation method of the digital-to-analog converter 300 that supports the interpolation chopping operation and the main buffer chopping operation will be described in further detail with reference to FIGS. 12 and 13.

FIG. 12 illustrates an example of an offset removal method of a digital-to-analog converter of FIG. 11. In FIG. 12, a main buffer chopping signal MB_CHOP transitions from high (H) to low (L) by two-frame unit and an interpolation chopping signal IN-CHOP transitions from high (H) to low (L) or from low (L) to high (H) by one-frame unit.

Referring to FIGS. 11 and 12, in a first frame, the main buffer chopping signal MB_CHOP and the interpolation chopping signal IN-CHOP are all at high (H) state. In this case, the first chopping unit 330 transmits VA and VB to the second chopping unit 340 in response to the interpolation chopping signal IN-CHOP of high (H) state. The second chopping unit 340 controls first and second select switches 341 and 342 so that the received VA and VB are provided to a V1 terminal and a V2 terminal of the amplifier 350 respectively in response to the main buffer chopping signal MB_CHOP of high (H) state. The second chopping unit 340 controls third and fourth select switches 343 and 344 so that a V3 terminal and a V4 terminal of the amplifier 350 are provided to an output terminal YOUT in response to the main buffer chopping signal MB_CHOP of high (H) state.

In a second frame, the interpolation chopping signal IN-CHOP transitions from a high (H) state to a low (L) state while the main buffer chopping signal MB_CHOP maintains a high (H) state. Thus, in the second frame, an interpolation chopping operation is performed in which the VA and VB cross each other to be respectively provided to the V2 terminal and the V1 terminal.

Specifically, the first chopping unit 330 performs a crossing operation to cross the VA and VB in response to the interpolation chopping signal IN-CHOP of low (L) and provides the crossed VB and VA to the second chopping unit 340. That is, the first chopping unit 330 provides the VB and VA to the first and second select switches 341 and 342 of the second chopping unit 340 respectively. Since the main buffer chopping signal MB_CHOP continues to maintain a high (H) state, the first and second select switches 341 and 342 of the second chopping unit 340 are connected to the V1 terminal and the V2 terminal respectively as illustrated in the first frame. Eventually, in the second frame, the VB and the VA are provided to the V1 terminal and the V2 terminal respectively.

In a third frame, the main buffer chopping signal MB_CHOP transitions from a high (H) state to a low (L) state. Thus, in the third frame, a main buffer chopping operation for removing an offset between a first differential pair (V1, V2) and a second differential pair (V3, V4) is performed.

Specifically, the first chopping unit 330 provides the VA and VB to the second chopping unit 340 in response to the interpolation chopping signal IN-CHOP of high (H) state. The second chopping unit 340 controls the third and fourth select switches 343 and 344 so that the VA and VB are provided to a V3 terminal and a V4 terminal of the amplifier 350 respectively in response to the main buffer chopping signal MB_CHOP of low (L) state. The second chopping unit 340 controls the first and second select switches 341 and 342 so that the V1 terminal and the V2 terminal are connected to the output terminal YOUT in response to the main buffer chopping signal MB_CHOP of low (L) state.

In this case, unlike the first frame in which the first differential pair (V1, V2) corresponds to the non-inverting input terminal (+) and the second differential pair (V3, V4) corresponds to the inverting input terminal (−), in the third frame, the second differential pair (V3, V4) corresponds to the non-inverting input terminal (+) to receive the VA and VB signals and the first differential pair (V1, V2) corresponds to the inverting input terminal (−) to be connected to the output terminal YOUT. An offset between the differential pairs may be removed by crossing input voltages to provide the crossed input voltages to the first differential pair (V1, V2) and the second differential pair (V3, V4).

In a fourth frame, the interpolation chopping signal IN_CHOP transitions from a high (H) state to a low (L) state while the main buffer chopping signal MB_CHOP maintains a low (L) state. Thus, in the fourth frame, an interpolation chopping operation is performed in which the VA and VB cross each other to be respectively provided to the V4 terminal and the V3 terminal.

As described above, the digital-to-analog converter 300 can support both an interpolation chopping operation and a main buffer chopping operation. Thus, an offset of the amplifier 350 can be effectively removed.

The aforementioned description is illustrative and the inventive concept is not limited to this configuration. For example, a transition time of the interpolation chopping signal IN_CHOP and the main buffer chopping signal MB_CHOP is not limited to that illustrated in FIG. 12 but may be variously adjusted depending on a user or a device being applied. In FIG. 13 below, an operating method of a digital-to-analog converter having a transition time different from that illustrated in FIG. 12 will be described by example.

FIG. 13 illustrates another example of an offset removal method of a digital-to-analog converter of FIG. 11. In FIG. 13, an interpolation chopping signal IN_CHOP transitions from high (H) to low (L) by two-frame unit and a main buffer chopping signal MB_CHOP transitions from high (H) to low (L) or from low (L) to high (H) by one-frame unit.

An operating method of the digital-to-analog converter 300 of FIG. 13 is similar to the operating method of FIG. 12 except the transition time of the interpolation chopping signal IN_CHOP and the main buffer chopping signal MB_CHOP. More specifically, the interpolation chopping signal IN_CHOP transitions from high (H) to low (L) by two-frame unit in FIG. 13, while the main buffer chopping signal MB_CHOP transitions from high (H) to low (L) by two-frame unit in FIG. 12. The main buffer chopping signal MB_CHOP transitions by one-frame unit in FIG. 13, while the interpolation chopping signal IN_CHOP transitions by one-frame unit in FIG. 12.

Thus, the digital-to-analog converter driven according to a bias condition of FIG. 13 can support both an interpolation chopping operation and a main buffer chopping operation like the digital-to-analog converter driven according to a bias condition of FIG. 12. The digital-to-analog converter 300 according to the inventive concept can variously adjust timing of the interpolation chopping signal IN_CHOP and the main buffer chopping signal MB_CHOP depending on a user or a device being applied.

In FIGS. 3 through 13, it was assumed that the digital-to-analog converter has a 9+1 bit structure. However, this is only illustrative and the inventive concept is not limited thereto. For example, in the case of processing image data of N bit (N is an integer which is 2 or greater than 2), an N-bit digital-to-analog converter according to the inventive concept may be embodied to have a structure of "(N−M)+M bit" (M is an integer which is 1 or greater than 1). For example, a 10-bit digital-to-analog converter may be embodied to have a variety of structures like "9+1 bit structure", "8+2 bit structure", "7+3 bit structure", etc. As an example of "(N−M)+M bit" structure according to the inventive concept, a digital-to-analog converter having a "8+2 bit structure" will be described in further detail below.

Figure 14:
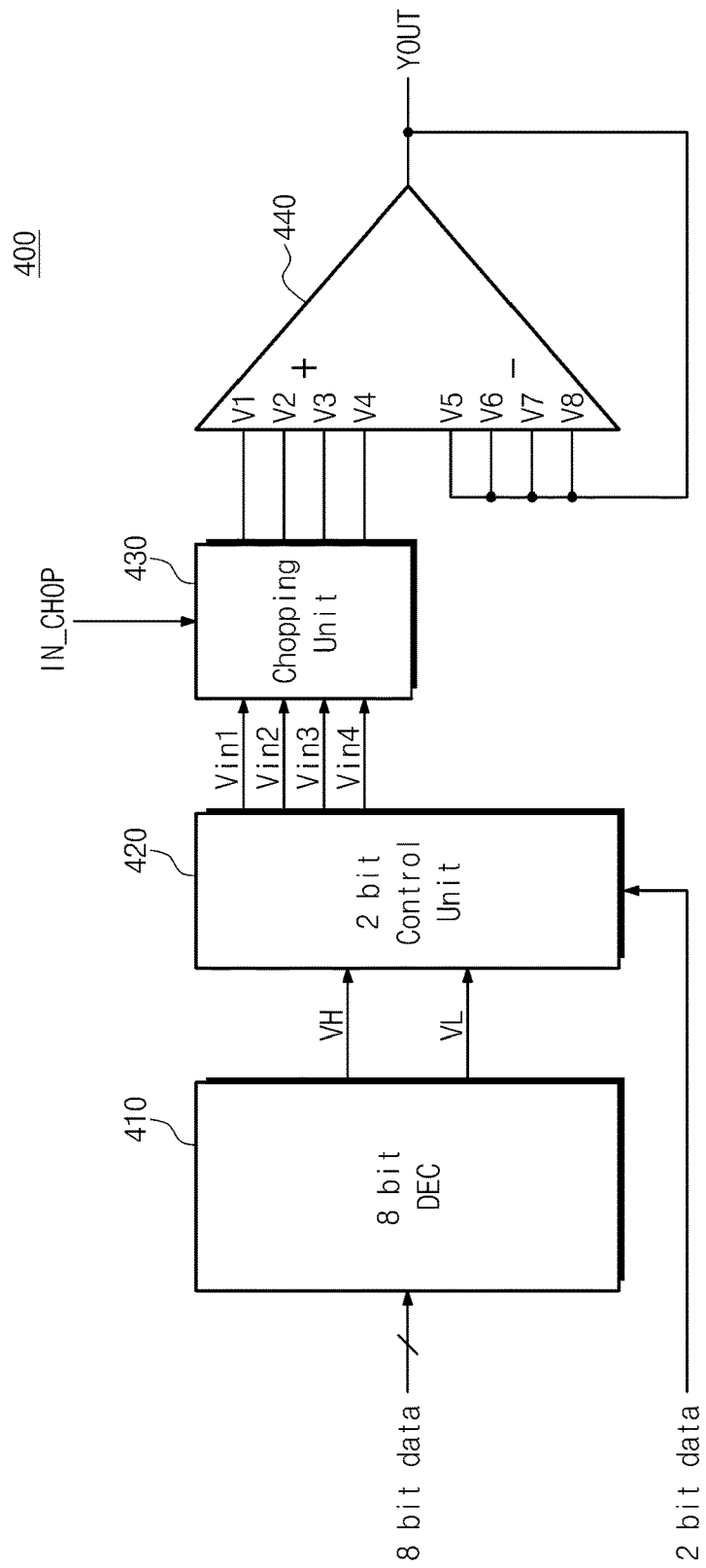
FIG. 14 illustrates a block diagram of yet another example of a digital-to-analog converter supporting a function of removing an offset in accordance with embodiments of the inventive concept.

FIG. 14 illustrates a block diagram of another example of a digital-to-analog converter 400 supporting a function of removing an offset in accordance with embodiments of the inventive concept. The digital-to-analog converter 400 of FIG. 14 is embodied in an 8+2 bit structure and supports an interpolation chopping operation to remove an offset. The digital-to-analog converter 400 of FIG. 14 is similar to the digital-to-analog converter 200 of FIG. 7, except that the digital-to-analog converter 400 is embodied in an 8+2 bit structure. Thus, differences between the digital-to-analog converter 400 and the digital-to-analog converter 200 will be mainly described. Referring to FIG. 14, the digital-to-analog converter 400 includes an 8-bit decoder 410, a 2-bit control unit 420, a chopping unit 430, and an amplifier 440.

The 8-bit decoder 410 receives 8-bit data, and selects and outputs two adjacent voltage levels (VH, VL) using the 8-bit data.

The 2-bit control unit 420 receives VH and VL from the 8-bit decoder 410 and receives 2-bit data from an external device. The 2-bit control unit 420 generates Vin1~Vin4 voltages using the 2-bit data and provides the generated Vin1~Vin4 voltages to the chopping unit 430. For example, each of the Vin1~Vin4 voltages may have a voltage level of either VA or VB. For example, the VA and the VB may have a voltage level between the VH and the VL. For example, the VA and the VB may be equal to a voltage level of either the VH or the VL, respectively. For example, at least one of the VA and the VB may be equal to a voltage level of at least one of the VH and the VL.

The chopping unit 430 is disposed between the 2-bit control unit 420 and the amplifier 440 and provides the Vin1~Vin4 voltages received from the 2-bit control unit 420 to V1~V4 terminals of the amplifier 440. The chopping unit 430 crosses the Vin1~Vin4 voltages in response to an interpolation chopping signal IN_CHOP and provides the crossed voltages to corresponding V1~V4 terminals respectively.

The amplifier 440 includes four terminals (V1, V2, V3, V4) connected to a non-inverting input terminal (+) and four terminals (V5, V6, V7, V8) connected to an inverting input terminal (−). The V1~V4 terminals are connected to the chopping unit 430 and receive any one of the VA voltage level and the VB voltage level. The V5~V8 terminals are all connected to an output terminal YOUT. A structure of the amplifier 440 will be described in further detail with reference to FIG. 15.

Figure 15:
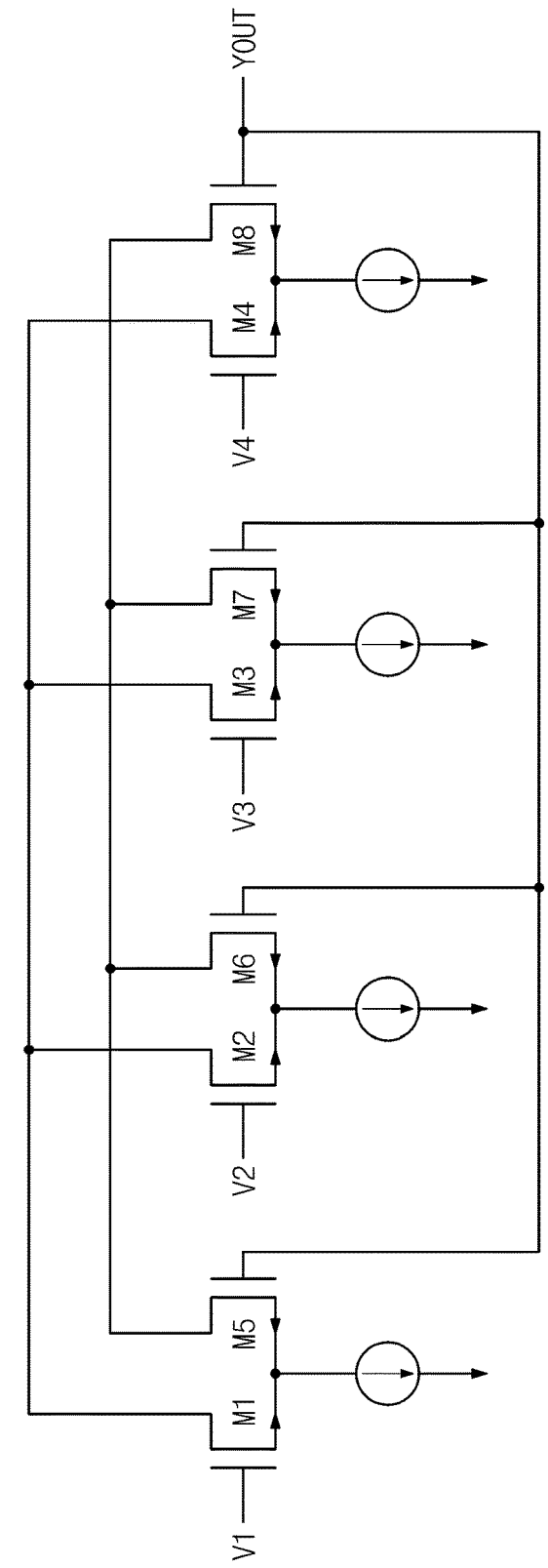
FIG. 15 illustrates a circuit diagram of an amplifier of FIG. 14 in further detail.

FIG. 15 illustrates an amplifier 440 of FIG. 14 in further detail. The amplifier 440 embodied using four differential operational amplifiers is illustrated in FIG. 15.

Referring to FIGS. 14 and 15, the non-inverting input terminal (+) and the inverting input terminal (−) of the amplifier 440 are both comprised of four terminals respectively. The V1~V4 terminals of the amplifier 440 corresponding to the non-inverting input terminal (+) correspond to gates of first transistor M1~fourth transistor M4 respectively. The V5~V8 terminals corresponding to the inverting input terminal (−) correspond to gates of fifth transistor M5~eighth transistor M8 respectively. The first transistor M1 and the fifth transistor M5 including the corresponding constant current source may be characterized as a first differential operational amplifier, the second transistor M2 and the sixth transistor M6 including the corresponding constant current source may be characterized as a second differential operational amplifier, the third transistor M3 and the seventh transistor M7 including the corresponding constant current source may be characterized as a third differential operational amplifier, and the fourth transistor M4 and the eighth transistor M8 including the corresponding constant current source may be characterized as a fourth differential operational amplifier.

To output analog voltage levels corresponding to 2-bit digital data, any one of the VA voltage level and the VB voltage level may be provided to the V1~V4 terminals of the amplifier 440. To remove an offset among the V1~V4 terminals corresponding to the non-inverting input terminal (+) of the amplifier 440, the chopping unit 430 crosses voltages provided to the V1~V4 terminals and provides the crossed voltages to the corresponding V1~V4 terminals respectively.

In an embodiment of the inventive concept, the number of frames needed to perform an interpolation chopping operation may be controlled according to voltages provided to the V1~V4 terminals. The detailed description will be provided with reference to FIG. 16.

FIG. 16 illustrates a drawing for explaining levels of voltages provided to V1~V4 terminals of an amplifier and the number of frames needed to perform an interpolation chopping operation in an interpolation chopping operation.

In a first case (case 1), if the VA voltage is equally provided to the V1~V4 terminals, an offset between the V1~V4 terminals almost does not occur. Since voltage levels provided to the V1~V4 terminals are the same (i.e., VA), an offset caused by mismatching among the first through fourth transistors M1~M4 corresponding to the non-inverting input terminal (+) or mismatching among the fifth through eighth transistors M5~M8 corresponding to the inverting input terminal (−) does not matter. Thus, in this case, an interpolation chopping operation is not needed.

However, in a second case (case 2), if the VA voltage level is provided to three terminals among the V1~V4 terminals and the VB voltage level is provided to the remaining one terminal, a voltage level of (3*VA+VB)/4 is outputted from the output terminal YOUT. Since a voltage of a different level is provided to at least one among the V1~V4 terminals corresponding to the non-inverting input terminal (+), an offset of the amplifier 440 may occur.

In this case, to reduce an output voltage deviation (DVO) in the output terminal YOUT, at least four frames are needed. That is, to perform an interpolation chopping operation for completely reducing an offset of the amplifier 440, the chopping unit 430 has to provide voltage levels of <VA, VA, VA, VB> to the <V1, V2, V3, V4> terminals respectively in a first frame, voltage levels of <VA, VA, VB, VA> to the <V1, V2, V3, V4> terminals respectively in a second frame, voltage levels of <VA, VB, VA, VA> to the <V1, V2, V3, V4> terminals respectively in a third frame, and voltage levels of <VB, VA, VA, VA> to the <V1, V2, V3, V4> terminals respectively in a fourth frame.

Similarly, in a fourth case (case 4), if the VB voltage is provided to three terminals among the V1~V4 terminals and the VA voltage is provided to the remaining one terminal, at least four frames are needed to perform a complete interpolation chopping operation.

However, in a third case (case 3), if the VA voltage is provided to two terminals among the V1~V4 terminals and the VB voltage is provided to the remaining two terminals, a voltage level of (2*VA+2*VB)/4 is output from the output terminal YOUT. In this case, an offset does not matter between terminals to which the same voltage level is provided. Thus, to reduce an output voltage deviation (DVO) in the output terminal YOUT, at least two frames are needed.

For example, if the VA voltage is provided to the V1 terminal and the V2 terminal and the VB voltage is provided to the V3 terminal and the V4 terminal, the chopping unit 430 can perform an interpolation chopping operation by providing voltage levels of <VA, VA, VB, VB> to the <V1, V2, V3, V4> terminals respectively in the first frame, and voltage levels of <VB, VB, VA, VA> to the <V1, V2, V3, V4> terminals respectively in the second frame.

As described above, the 10-bit digital-to-analog converter 400 may be embodied in an 8+2 bit structure. In this case, an area occupied by a decoder of the digital-to-analog converter of an 8+2 bit structure is reduced to ¼ of an area occupied by a decoder of the digital-to-analog converter of a 10 bit structure. Thus, the digital-to-analog converter of an 8+2 bit structure can be embodied in a much smaller size compared with the digital-to-analog converter of a 9+1 bit structure.

The aforementioned description is illustrative and the inventive concept is not limited to this configuration. For example, the digital-to-analog converter of an 8+2 bit structure described in FIGS. 14 through 16 may be embodied to perform both the interpolation chopping operation and the main buffer chopping operation similarly to the digital-to-analog converter of FIG. 11.

Figure 17:
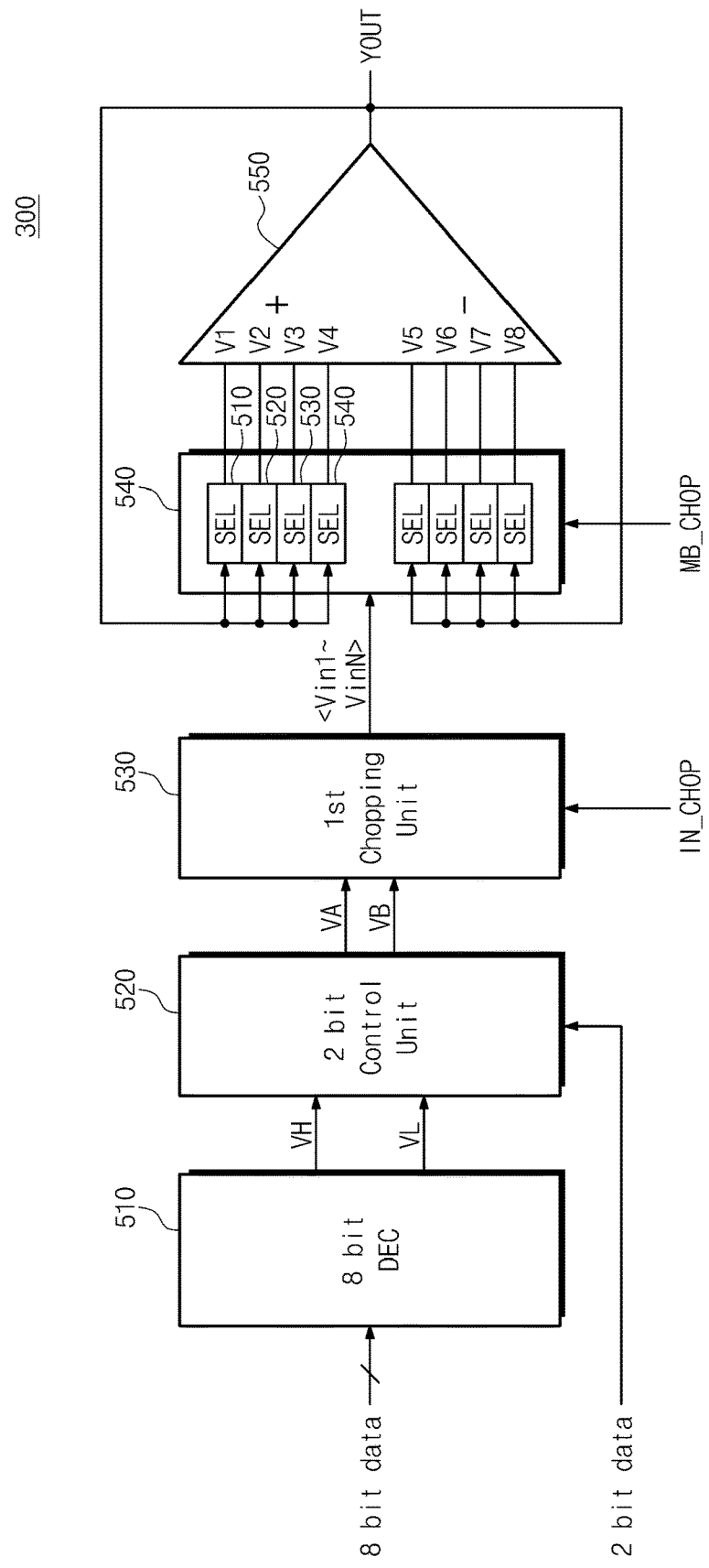
FIG. 17 illustrates an example of a digital-to-analog converter in accordance with embodiments of the inventive concept.

For example, to perform both the interpolation chopping operation and the main buffer chopping operation, a digital-to-analog converter 500 of an 8+2 bit structure illustrated in FIG. 17 may be embodied. The digital-to-analog converter 500 of FIG. 17 can operate under the bias conditions such as shown in FIGS. 18 through 22.

In this case, since the digital-to-analog converter 500 supports both the interpolation chopping operation and the main buffer chopping operation, cases (case1~case4) need 8 frames as should be understood in view of FIGS. 18 through 22. The digital-to-analog converter 400 of FIG. 14 supporting only an interpolation chopping operation needs 4 frames such as described with respect to FIG. 16 to perform an interpolation chopping operation. Since the digital-to-analog converter 500 of FIG. 17 supports not only an interpolation chopping operation but also a main buffer chopping operation, it needs frames (i.e., 8 frames) which are two times the number of frames which the digital-to-analog converter 400 of FIG. 14 needs. Since a structure and an operation of the digital-to-analog converter 500 of FIGS. 17 through 22 are similar to those of the digital-to-analog converters described above, a detailed description thereof will be omitted.

FIG. 23 illustrates a drawing for explaining a digital-to-analog converter capable of not only reducing chopping time but also supporting a function of removing an offset in accordance with embodiments of the inventive concept. In FIG. 23, bias conditions by frame of a digital-to-analog converter performing an interpolation chopping operation is illustrated. For convenience of description, it is assumed that a digital-to-analog converter described with respect to FIG. 23 has the same structure as the digital-to-analog converter 400 of FIG. 14.

In the case of embodying a digital-to-analog converter in an 8+2 bit structure, at least four frames are needed to completely reduce an offset among the V1~V4 terminals corresponding to the non-inverting input terminal (+) such as the second and fourth cases of FIG. 16. An interpolation chopping method according to the inventive concept may be usefully applied to a device that has to provide a high definition image.

However, depending on a device, even though quality of an image is somewhat degraded, a high speed chopping operation may nevertheless be necessary. For example, in the case that the inventive concept is applied to a device having a comparatively low speed clock, in order to prevent flicker of an image it may be necessary to reduce chopping time by reducing the number of times of frames even though doing so would not completely reduce the offset.

To remove an offset of a device having a comparatively low speed clock, the digital-to-analog converter according to the inventive concept can group terminals of amplifiers and can operate so that an interpolation chopping operation is performed between the grouped terminals. For example, as illustrated in FIG. 23, in the case of a digital-to-analog converter of 8+2 bit structure, V1 and V2 terminals among V1~V4 terminals of the non-inverting input terminal (+) may be grouped as a first terminal group, and V3 and V4 terminals among V1~V4 terminals of the non-inverting input terminals may be grouped as a second terminal group.

In this case, referring to a second frame of FIG. 23, an interpolation chopping operation is performed only between the first terminal group and the second terminal group. That is, an interpolation chopping operation may not be performed between the V1 terminal and the V2 terminal that belong to the first terminal group, and similarly an interpolation chopping operation may not be performed between the V3 terminal and the V4 terminal that belong to the second terminal group. Thus, the digital-to-analog converter according to the inventive concept can perform an interpolation chopping operation more quickly.

In a method of grouping the V1~V4 terminals as the first and second groups, the digital-to-analog converter according to the inventive concept can group the terminals so that the same voltage level is provided to at least one terminal group. For example, as illustrated in FIG. 23, in the case that the same VA voltage level is provided to the V1 terminal and the V2 terminal, the digital-to-analog converter can group the V1 terminal and the V2 terminal as one terminal group. As another example, in the case that <VA, VB, VA, VB> voltages are provided to <V1, V2, V3, V4> terminals respectively, the digital-to-analog converter can group the V1 and V3 terminals as a first terminal group and the V2 and V4 terminals as a second terminal group. In this case, since an offset does not matter among terminals to which the same voltage level is provided and thereby an interpolation chopping operation is not needed, reliability of the digital-to-analog converter may be improved.

For convenience of description, a method of grouping terminals of an amplifier through an interpolation chopping operation was described with respect to FIG. 23. This is illustrative and the inventive concept is not limited thereto. For example, the method of grouping terminals of the amplifier of FIG. 23 may also be applied to a digital-to-analog converter supporting both an interpolation chopping operation and a main buffer chopping operation.

FIGS. 24 through 27 illustrate drawings for explaining a digital-to-analog converter supporting not only an interpolation chopping operation but also a main buffer chopping operation between grouped terminals. For convenience of description, it is assumed that a digital-to-analog converter to be described with respect to FIGS. 24 through 27 has the same structure as the digital-to-analog converter 500 of FIG. 17. Similar as described with respect to FIG. 23, it is assumed that V1 and V2 terminals among V1~V4 terminals of the non-inverting input terminal (+) may be grouped as a first terminal group, and V3 and V4 terminals among V1~V4 terminals of the non-inverting input terminal may be grouped as a second terminal group.

Referring to FIGS. 24 through 27, the digital-to-analog converter according to the inventive concept can group terminals of an amplifier and can operate so that an interpolation chopping operation is performed between grouped terminals. Thus, the number of frames needed may be reduced compared with the digital-to-analog converter 500 of FIG. 17.

As described with respect to FIGS. 18 through 22, the digital-to-analog converter 500 of FIG. 17 needs 8 frames with respect to each of the cases (case1~case4) to support both an interpolation chopping operation and a main buffer chopping operation. However, in the case of grouping terminals of an amplifier and performing an interpolation chopping operation only between the grouped terminals, the number of frames needed to perform an interpolation chopping operation may be reduced to half. That is, as illustrated in FIGS. 24 through 27, each of the cases (case 1~case 4) needs four frames. Accordingly, the digital-to-analog converter according to the inventive concept can perform an interpolation chopping operation more quickly.

The operating method described with reference to FIGS. 24 through 27 and the inventive concept is not limited thereto. For example, it was described that in FIGS. 24 through 27, a main buffer chopping operation is performed in a state in which an interpolation chopping signal IN_CHOP maintains a high (H) or low (L) state. However, the inventive concept may be embodied so that an interpolation chopping operation is performed in a state in which an interpolation chopping signal IN_CHOP maintains a high (H) or low (L) state.

Figure 28:
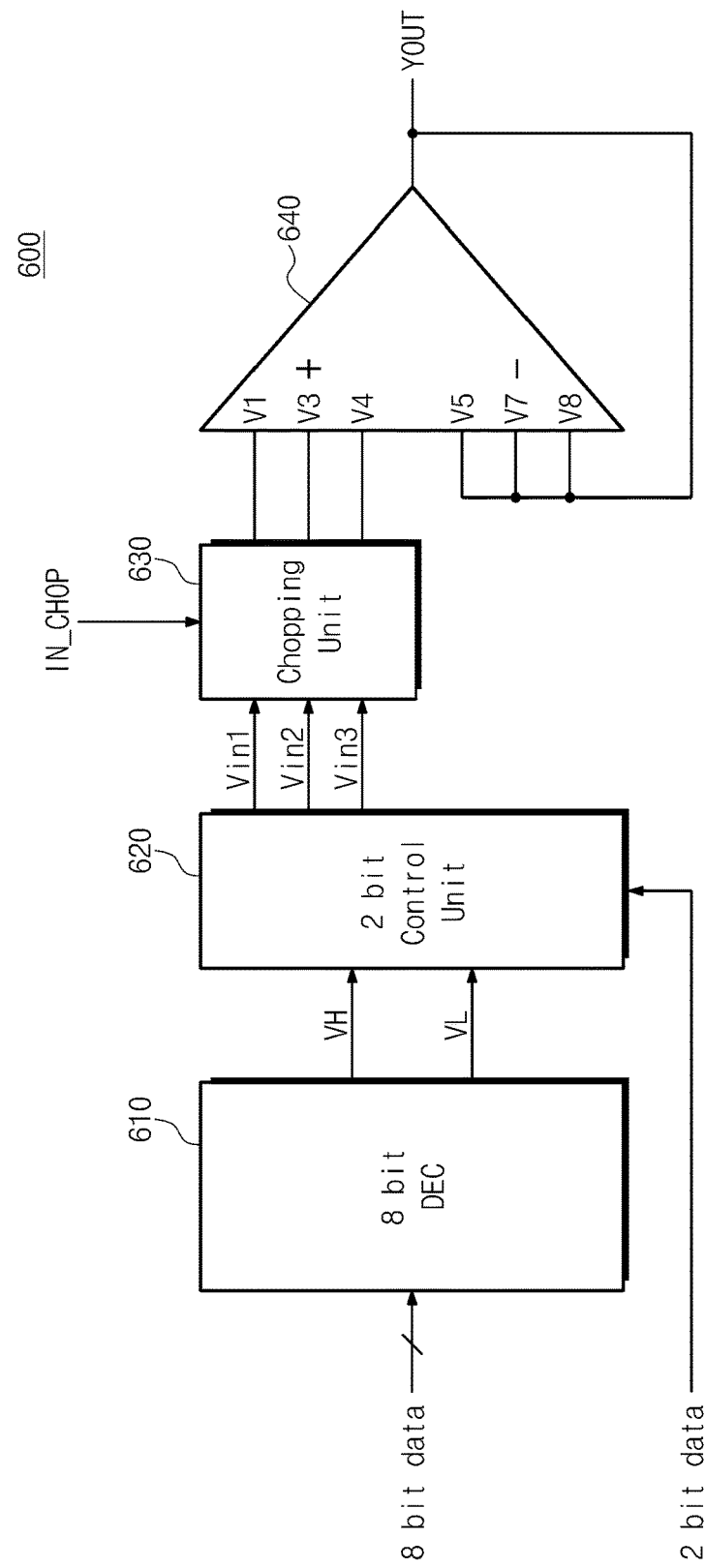
FIG. 28 illustrates a block diagram of still yet another example of a digital-to-analog converter supporting a function of removing an offset in accordance with embodiments of the inventive concept.
Figure 29:
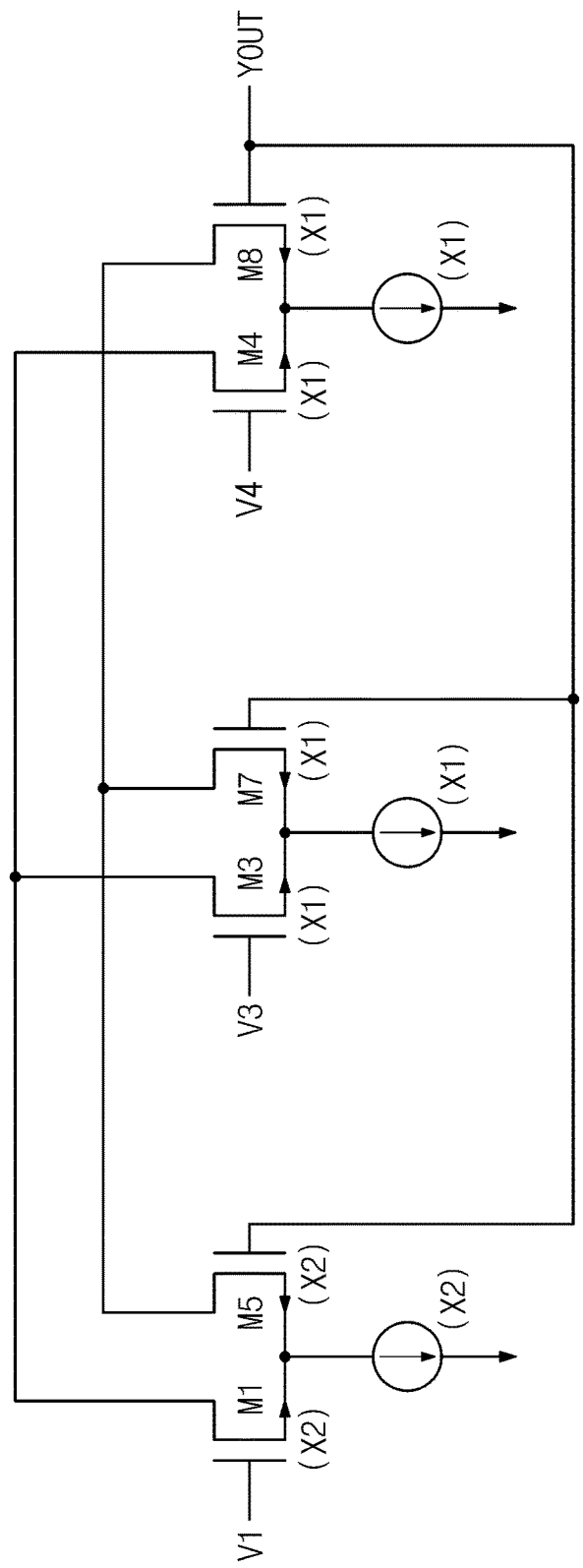
FIG. 29 illustrates a structure of an amplifier of a digital-to-analog converter of FIG. 28 in detail.

FIG. 28 illustrates a block diagram of another example of a digital-to-analog converter 600 supporting a function of removing an offset in accordance with embodiments of the inventive concept. FIG. 29 illustrates a structure of an amplifier 640 of a digital-to-analog converter 600 of FIG. 28 in detail. Structures of the digital-to-analog converter 600 and the amplifier 640 of FIGS. 28 and 29 are similar to those of the digital-to-analog converter 400 and the amplifier 440 of FIGS. 14 and 15. For brevity and clarity of description, differences between the digital-to-analog converter 600 and the amplifier 640 of FIGS. 28 and 29 and the digital-to-analog converter 400 and the amplifier 440 of FIGS. 14 and 15 will be mainly described.

Referring to FIG. 28, the digital-to-analog converter 600 is embodied in an 8+2 bit structure and supports an interpolation chopping operation to remove an offset. The digital-to-analog converter 600 includes an 8-bit decoder 610, a 2-bit control unit 620, a chopping unit 630, and an amplifier 640.

Unlike amplifier 440 of FIG. 14 which respectively includes four terminals corresponding to the non-inverting input terminal (+) and four terminals corresponding to the inverting input terminal (−), the amplifier 640 in FIG. 28 includes three terminals (V1, V3, V4) corresponding to a non-inverting input terminal (+) and three terminals (V5, V7, V8) corresponding to an inverting input terminal (−). This means that a V1 terminal of the amplifier 640 of FIG. 28 is embodied in the form in which the V1 and V2 terminals of the amplifier 440 of FIG. 14 are integrated as one terminal. This also means that a V5 terminal of the amplifier 640 of FIG. 28 is embodied in the form in which the V5 and V6 terminals of the amplifier 440 of FIG. 14 are integrated as one terminal.

Referring to FIG. 29, the non-inverting input terminal (+) and the inverting input terminal (−) of the amplifier 640 are each constituted by three transistors respectively. V1, V3 and V4 terminals corresponding to the non-inverting input terminal (+) correspond to first, third and fourth transistors M1, M3 and M4 respectively. V5, V7 and V8 terminals corresponding to the inverting input terminal (−) correspond to fifth, seventh and eighth transistors M5, M7 and M8 respectively.

In this case, the capacity of a differential operational amplifier including the first and fifth transistors M1 and M5 is two times as large as the capacity of the differential operational amplifier including the third and seventh transistors M3 and M7 and the differential operational amplifier including the fourth and eighth transistors M4 and M8. That is, as illustrated in FIG. 29, the capacity of the first or fifth transistors M1 or M5 may be twice as large as capacity of third, fourth, seventh or eighth transistor M3, M4, M7 and M8. The capacity of a constant current source of the differential operational amplifier including the first and fifth transistors M1 and M5 may also be twice as large as the capacity of the constant current sources of the differential operational amplifier including the third and seventh transistors M3 and M7 and the differential operational amplifier including the fourth and eighth transistors M4 and M8.

As described above, the digital-to-analog converter 600 of FIG. 28 can embody the amplifier 640 in a smaller area by integrating two terminals into one terminal.

The digital-to-analog converter 600 of FIG. 28 will be described with reference to FIGS. 30 through 33 in further detail.

FIG. 30 illustrates levels of voltages being provided to V1, V3 and V4 terminals of an amplifier 640 of FIG. 28 and cases of its output voltage in an interpolation chopping operation. FIGS. 31 through 33 illustrate bias conditions in each case in accordance with embodiments according to the inventive concept.

Referring to FIG. 30, a VA voltage is provided to the V1, V3 and V4 terminals in the first case (case 1). In this case, an offset among the V1, V3 and V4 terminals does not matter and thereby an output terminal YOUT outputs the VA voltage equally.

Referring to FIGS. 30 and 31, in the second case (case 2), VA, VA and VB voltages are provided to the V1, V3 and V4 terminals respectively. In this case, since the output terminal YOUT outputs a voltage level of (2*VA+VA+VB)/4, an interpolation chopping operation for removing an offset among the V1, V3 and V4 terminals may be performed. In this case, as illustrated in FIG. 31, an interpolation chopping operation may be performed so that VA, VB and VA voltages are provided to the V1, V3 and V4 terminals respectively in a second frame. At this time, the output terminal YOUT outputs a voltage level of (2*VA+VB+VA)/4 and an output voltage value in the second frame is the same as the output value in the first frame. Thus, the digital-to-analog converter can remove an offset among the V1, V3 and V4 terminals.

Referring to FIGS. 30 and 32, in a third case (case 3), VA, VB and VB voltages are provided to the V1, V3 and V4 terminals respectively. In this case, since the output terminal YOUT outputs a voltage level of 2(VA+VB)/4, an interpolation chopping operation for removing an offset among the V1, V3 and V4 terminals may be performed. In this case, as illustrated in FIG. 32, an interpolation chopping operation may performed so that VB, VA and VA voltages are provided to the V1, V3 and V4 terminals respectively in the second frame. At this time, the output terminal YOUT outputs a voltage level of 2(VA+VB)/4 and an output voltage value in the second frame is the same as the output value in the first frame. Thus, the digital-to-analog converter can remove an offset among the V1, V3 and V4 terminals.

Referring to FIGS. 30 and 33, in a fourth case (case 4), VB, VA and VB voltages are provided to the V1, V3 and V4 terminals respectively. In this case, since the output terminal YOUT outputs a voltage level of (2*VB+VA+VB)/4, an interpolation chopping operation for removing an offset among the V1, V3 and V4 terminals may be performed. In this case, as illustrated in FIG. 33, an interpolation chopping operation may performed so that VB, VB and VA voltages are provided to the V1, V3 and V4 terminals respectively in the second frame. At this time, the output terminal YOUT outputs a voltage level of (2*VB+VB+VA)/4 and an output voltage value in the second frame is the same as the output value in the first frame. Thus, the digital-to-analog converter can remove an offset among the V1, V3 and V4 terminals.

The aforementioned description is illustrative and the inventive concept is not limited thereto. For example, it was described that the digital-to-analog converter 600 of FIG. 28 performs only an interpolation chopping operation. However, the digital-to-analog converter 600 may be embodied to perform an interpolation chopping operation and a main buffer chopping operation at the same time and for brevity of description, a detailed description thereof may be omitted.

Figure 34:
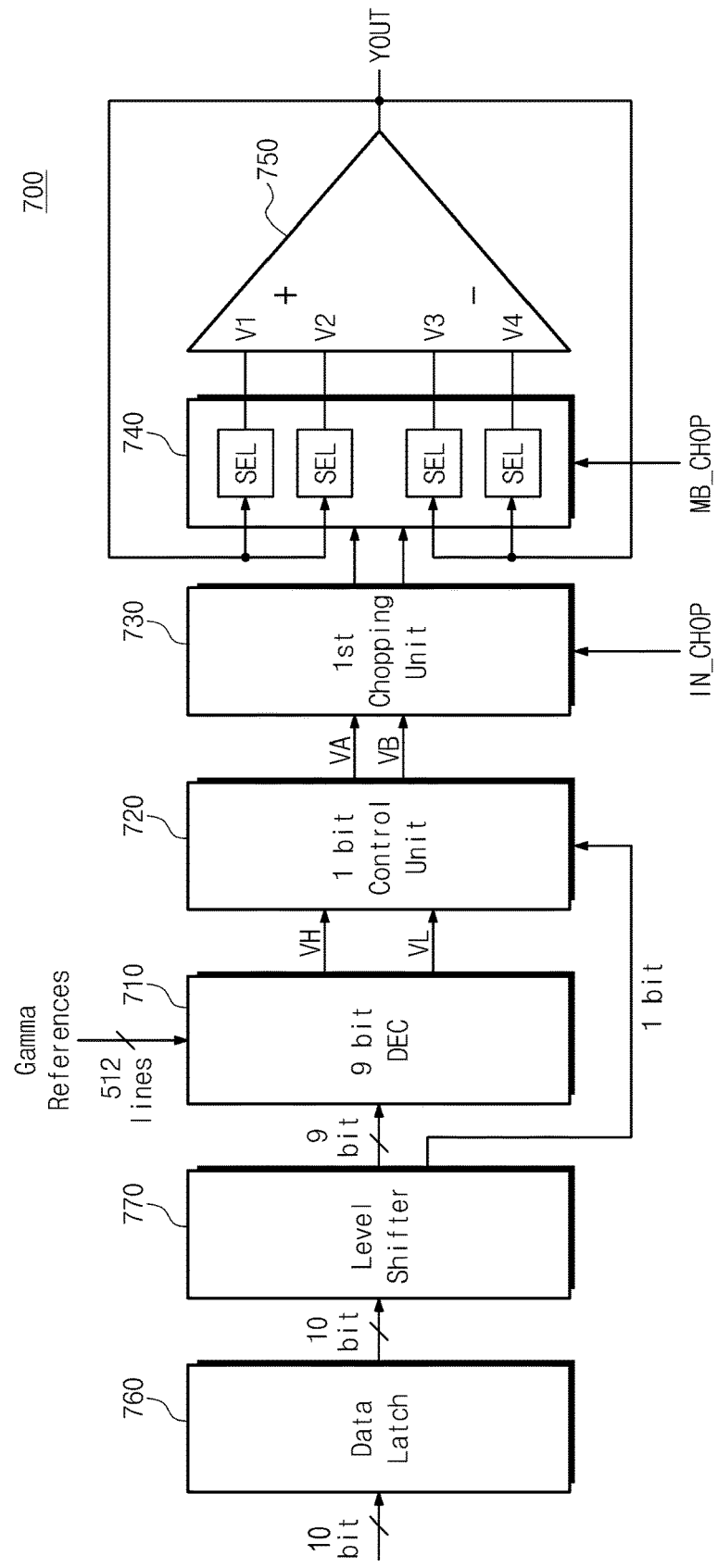
FIG. 34 illustrates a block diagram of a source driver cell in accordance with embodiments of the inventive concept.

FIG. 34 illustrates a block diagram of a source driver cell 700 in accordance with embodiments of the inventive concept. The source driver cell 700 of FIG. 34 may be configured to perform the interpolation chopping operation and/or the main buffer chopping operation described above. For convenience of description, it is assumed that the source driver cell 700 of FIG. 34 includes a digital-to-analog converter of a 9+1 bit structure. Referring to FIG. 34, the source driver cell 700 includes a 9-bit decoder 710, a 1-bit control unit 720, a first chopping unit 730, a second chopping unit 740, an amplifier 750, a data latch 760 and a level shifter 770.

The data latch 760 receives 10-bit RGB data from the outside. The data latch 760 provides the received 10-bit RGB data to the level shifter 770 and the level shifter 770 sequentially shifts the 10-bit RGB data based on a clock signal. The level shifter 770 provides 9-bit data to the 9-bit decoder 710 and provides 1-bit data to the 1-bit control unit 720.

The 9-bit decoder 710, the 1-bit control unit 720, the first chopping unit 730, the second chopping unit 740, and the amplifier 750 output analog data corresponding to the received digital data and perform the interpolation chopping operation and/or the main buffer chopping operation described above to remove an offset of the amplifier 750.

Figure 35:
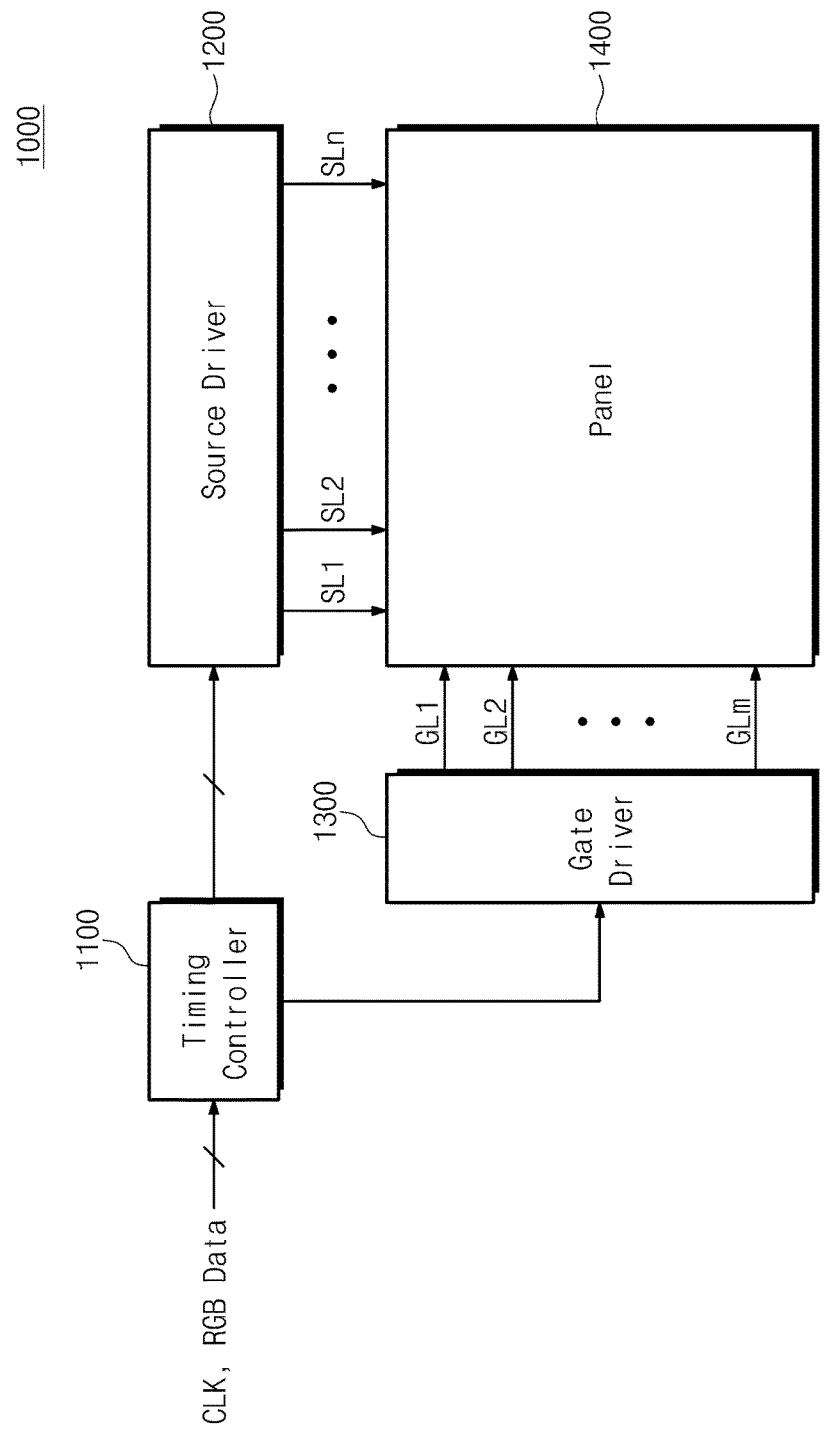
FIG. 35 illustrates a display device in accordance with embodiments of the inventive concept.

FIG. 35 illustrates a display device in accordance with embodiments of the inventive concept. Referring to FIG. 35, a display device 1000 includes a timing controller 1100, a source driver 1200, a gate driver 1300, and a display panel 1400.

The timing controller 1100 receives a vertical synchronous signal VSYNC, a horizontal synchronous signal HSYNC, a clock CLK and an RGB (red, green, blue) data with respect to inputted frame, outputs a vertical driver control signal (e.g., VSYNC) and RGB data to control the source driver 1200 and outputs a gate driver control signal (e.g., HSYNC) to control the gate driver 1300.

The source driver 1200 outputs gray scale voltages (in other words, output signals) corresponding to RGB data to the panel 1400 through source lines SL1~SLn (n is a natural number) in response to the RGB data and the vertical synchronous signal VSYNC output from the timing controller 1100. The source driver 1200 includes a plurality of amplifiers for outputting the gray voltages.

The source driver 1200 may be embodied to support an interpolation chopping operation and/or a main buffer chopping operation as described above and thereby may be embodied by a small area compared with a general source driver.

The gate driver 1300 receives a horizontal synchronous signal HSYNC output from the timing controller 1100 and controls gate lines GL1~GLm (m is a natural number) to sequentially output analog data output from the source driver 1200 to the panel 1400.

The display panel 1400 includes a plurality of pixels formed at a place where the gate lines GL1~GLm and the source lines SL1~SLn cross one another. The display panel 1400 may be, for example, a liquid crystal display (LCD) panel.

The digital-to-analog converter according to the inventive concept has an X+Y bit structure and can remove an offset by performing an interpolation chopping operation and/or a main buffer chopping operation at the same time. Thus, the digital-to-analog converter according to the inventive concept can be embodied in a small area and can process high bit image data.

Having described the exemplary embodiments of the inventive concept, it is further noted that it is readily apparent to those of reasonable skill in the art that various modifications may be made without departing from the spirit and scope of the inventive concept which is defined by the metes and bounds of the appended claims.

What is claimed is:
1. A digital-to-analog converter comprising:
   a decoder configured to convert data bits into voltages;
   an amplifier including at least two input terminals corresponding to a non-inverting input terminal, and configured to provide an output voltage corresponding to the data bits; and
   a chopper configured to receive the voltages, provide the voltages to the amplifier, and perform a chopping operation between the voltages provided to the at least two input terminals corresponding to the non-inverting input terminal.

2. The digital-to-analog converter of claim 1, wherein the at least two input terminals comprise a first input terminal and a second input terminal corresponding to the non-inverting input terminal, and the voltages comprise a first voltage and a second voltage different from the first voltage, and
   wherein the chopper is configured to provide the first voltage and the second voltage respectively to the first and second input terminals during a first frame, and provide the second voltage and the first voltage respectively to the first and second input terminals during a second frame.

3. The digital-to-analog converter of claim 2, wherein the amplifier further comprises a third input terminal and a fourth input terminal corresponding to an inverting input terminal, and
   wherein the third input terminal and the fourth input terminal are connected to an output terminal of the digital-to-analog converter during the first and second frames.

4. The digital-to-analog converter of claim 1, wherein the at least two input terminals comprise first through fourth input terminals corresponding to the non-inverting input terminal, and the amplifier further comprises fifth through eighth input terminals corresponding to an inverting input terminal, and wherein the chopper is configured to perform a chopping operation between the first through fourth input terminals during at least two frames.

5. The digital-to-analog converter of claim 4, wherein the chopper is configured to group the first and second input terminals as a first terminal group, group the third and fourth input terminals as a second terminal group, and perform a chopping operation between the first terminal group and the second terminal group during the at least two frames.

6. The digital-to-analog converter of claim 5, wherein the voltages comprise a first voltage and a second voltage different from the first voltage, wherein during a first frame from among the at least two frames, the chopper is configured to provide the first voltage to the first and second input terminals corresponding to the first terminal group, and the first and second voltages to the third and fourth input terminals corresponding to the second terminal group, and wherein during a second frame from among the at least two frames, the chopper is configured to provide the first and second voltages to the first and second input terminals corresponding to the first terminal group, and the first voltage to the third and fourth input terminals corresponding to the second terminal group.

7. The digital-to-analog converter of claim 1, wherein the at least two input terminals comprise first through third input terminals, and a capacity of a transistor corresponding to the first input terminal is larger than a capacity of a transistor corresponding to the second input terminal or a capacity of a transistor corresponding to the third input terminal.

8. The digital-to-analog converter of claim 7, wherein the voltages comprise a first voltage and a second voltage greater than the first voltage, wherein during a first frame the chopper is configured to provide any one of the first voltage and the second voltage to the first through third input terminals, and the amplifier is configured to output a third voltage greater than the first voltage and smaller than the second voltage from an output terminal of the amplifier, and during a second frame the chopper is configured to provide any one of the first and second voltages to the first through third input terminals and the amplifier is configured to output a voltage of a same level as the third voltage from the output terminal.

9. The digital-to-analog converter of claim 7, wherein in a case that levels of the voltages provided to the second and third input terminals during a first frame are different from each other, the chopper is configured to cross levels of the voltages provided to the second and third input terminals during a second frame.

10. The digital-to-analog converter of claim 8, wherein in a case that the second voltage is provided to the second and third input terminals during the first frame, the chopper is configured to provide the first voltage to the second and third input terminals during the second frame.

11. The digital-to-analog converter of claim 1, wherein the amplifier further comprises at least two input terminals corresponding to an inverting input terminal, and wherein the chopper comprises a main buffer chopper configured to perform a chopping operation between the non-inverting input terminal and the inverting input terminal.

12. A digital-to-analog converter comprising:
a decoder configured to convert data bits into voltages;
an amplifier including at least two input terminals corresponding to a non-inverting input terminal and at least two input terminals corresponding to an inverting input terminal, and configured to provide an output voltage corresponding to the data bits responsive to the voltages;
a first chopper configured to perform a chopping operation between the voltages provided to the at least two input terminals corresponding to the non-inverting input terminal; and
a second chopper configured to perform a chopping operation between the voltages provided to the non-inverting input terminal and the inverting input terminal.

13. The digital-to-analog converter of claim 12, wherein the at least two input terminals corresponding to the non-inverting input terminal comprise first and second input terminals, and the voltages comprise a first voltage and a second voltage different from the first voltage, and wherein during a first frame the first chopper is configured to provide the first voltage and the second voltage respectively to the first and second input terminals, and during a second frame the first chopper is configured to provide the second voltage and the first voltage respectively to the first and second input terminals.

14. The digital-to-analog converter of claim 13, wherein the at least two input terminals corresponding to the inverting input terminal comprise third and fourth input terminals, and during the first and second frames, the second chopper is configured to form an electrical path through which the first and second voltages are provided between the first chopper and the first and second input terminals, and connect the third and fourth input terminals to an output terminal of the amplifier.

15. The digital-to-analog converter of claim 14, wherein during third and fourth frames, the second chopper is configured to form an electrical path through which the first and second voltages are provided between the first chopper and the third and fourth input terminals, and connect the first and second input terminals to the output terminal, and wherein during the third frame the first chopper is configured to provide the first and second voltages respectively to the third and fourth input terminals, and during the fourth frame the first chopper is configured to provide the second and first voltages respectively to the third and fourth input terminals.

16. A display device comprising:
a display panel including a plurality of pixels connected to gate lines and source lines; and
a source driver comprising a plurality of source driver cells configured to output gray scale voltages corresponding to received RGB data to the display panel through the source lines,
the source driver cells each including a digital-to-analog converter comprising
an amplifier including at least two input terminals corresponding to a non-inverting input terminal, at least two input terminals corresponding to an inverting input terminal, and an output terminal configured to provide a corresponding gray scale voltage from among the gray scale voltages,
a decoder configured to decode the RGB data into at least first and second voltages, and
a chopper configured to selectively provide the at least first and second voltages to the amplifier and perform a chopping operation between the at least first and second voltages provided to the at least two input terminals corresponding to the non-inverting input terminal.

17. The display device of claim 16, wherein the chopper is further configured to perform a chopping operation between the at least first and second voltages provided to the non-inverting input terminal and the inverting input terminal.

18. The display device of claim 17, wherein the at least two input terminals corresponding to the inverting input terminal are connected to the output terminal.

19. The display device of claim 16, wherein the display panel comprises a liquid crystal display panel.

* * * * *